United States Patent [19]
Kawakami

[11] Patent Number: 5,517,104
[45] Date of Patent: May 14, 1996

[54] LEAD WIRE DC CURRENT SENSOR WITH SATURATED DETECTING CORE

[75] Inventor: Makoto Kawakami, Osaka, Japan

[73] Assignee: Sumitomo Special Metals Co., Ltd., Osaka, Japan

[21] Appl. No.: 361,545

[22] Filed: Dec. 22, 1994

[30] Foreign Application Priority Data

Dec. 29, 1993 [JP] Japan ................................. 5-352054

[51] Int. Cl.$^6$ ................................................. G01R 33/02
[52] U.S. Cl. .......................................................... 324/117 R
[58] Field of Search .................. 324/117 R, 126, 324/127, 117 H, 252, 253; 336/174, 175, 229, 83, 214

[56] References Cited

U.S. PATENT DOCUMENTS 1,287,982  12/1918  Hartley ..................................... 336/229
4,914,381   4/1990  Narod ..................................... 324/117 R Primary Examiner—Vinh P. Nguyen
Attorney, Agent, or Firm—Watson Cole Grindle & Watson

[57] ABSTRACT

A DC current sensor, comprising a detecting core consisting of an annular soft magnetic material having a hollow portion extending in a circumferential direction within the core; an excitation coil wound and disposed in a circumferential direction in the hollow portion; a detecting coil toroidally wound around the detecting core; a lead wire through which a DC current for non-contact detection flows, and extended through the center of the detecting core; an AC current supply for applying current to the excitation coil for periodically magnetically saturating the entire detecting core in both the circumferential and a direction perpendicular thereto, whereby the magnetic flux produced in the detecting core can be modulated according to the DC current flowing through the lead wire and being detected upon excitation of the excitation coil; and the detecting coil producing an electromotive force having a frequency twice the excitation current for detecting the DC current flowing through the lead wire.

13 Claims, 18 Drawing Sheets

CURRENT RATES AT SATURATION

FREQUENCY fo

CURRENT RATES AT SATURATION

FREQUENCY 2fo

FREQUENCY 2fo

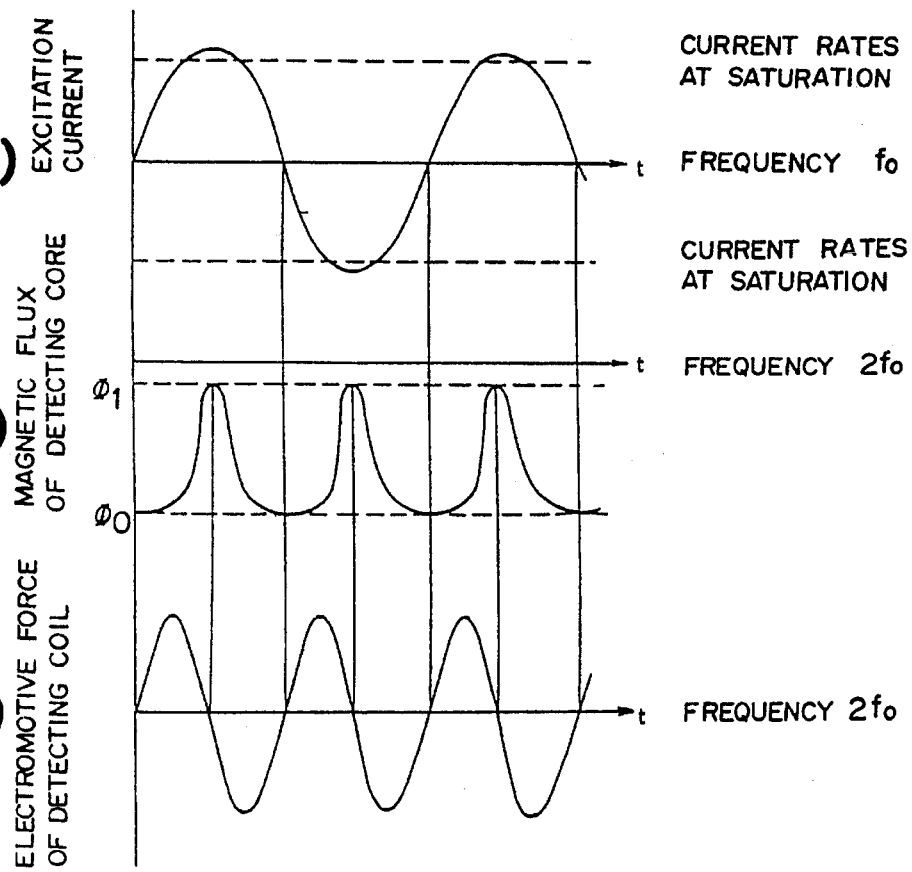

HYSTERESIS OF DETECTING CORE

MAGNETIC FIELD APPLIED TO DETECTING CORE

MAGNETIC FLUX PRODUCED IN DETECTING CORE $T_1 - T_2 = 0$

MAGNETIC FLUX PRODUCED IN DETECTING CORE $T_1 - T_2 > \infty I$

1

LEAD WIRE DC CURRENT SENSOR WITH SATURATED DETECTING CORE

BACKGROUND OF THE INVENTION

1. Field of the Invention

The present invention relates to a DC current sensor utilized in a wide range of field such as preventive maintenances of installations by leakage detections of, DC generating apparatus such as a solar cell, fuel cell generating system and the like, DC control circuits and the like of a power plant, a substation and a large switchboard for industrial plant, and further, insulation deterioration in various DC equipments, more particularly, it relates to a sensitive DC current sensor having a relatively simple construction and a good detecting capability for even a micro-current variation, realizing a stable detection.

2. Description of the Prior Art

In recent year, though equipments utilizing a DC current are used in a wide range of field, demands on a sensor for detecting load of a DC motor for necessary control and a DC current sensor used in a DC current leakage breaker and the like are enhanced in maintenance for operating the various equipments smoothly.

As such DC current sensors, those consisting of a magnetic amplifier type, magnetic multi-vibrator type (Japanese Patent Application Laid Open Nos. Sho 47-1644, Sho 53-31176, Sho 49-46859), Hall device type and the like are well known.

Both the magnetic amplifier type and magnetic multivibrator type use a core of soft magnetic material constituted by winding a detecting coil in a toroidal shape, wherein by extending a lead wire being detected through the core for DC magnetic deflection of the core of soft magnetic material within a saturated magnetic flux density (Bs) by a DC current flowing through the lead wire being detected, an alternating magnetic flux produced by applying an AC current to the coil wound around the core beforehand produces an unbalance when saturated in the positive and negative directions, and the variation is detected by the detecting coil. Since the magnetic flux variation is given in the core beforehand in the former type, a configuration of applying the AC current of a predetermined value by winding the excitation coil around the core is adopted, in the latter type, it is so constituted that the self-excitation takes place by the action of semiconductors and the like in a circuit connected to the detecting coil, and a duty ratio of an oscillation waveform is changed responsive to the current being detected for oscillation.

Furthermore, the Hall device type is so constituted that, the lead wire being detected is wound in a toroidal shape directly around the core of soft magnetic material which is formed partly with a gap disposing the Hall device, and the magnetic flux variation in the core responsive to the DC current variation flowing through the lead wire being detected is detected directly by the Hall device.

However, it is the present situation that, the DC current sensors of the above-mentioned types are not always constituted to respond to the micro-current variation of a DC leakage breaker and the like by the following reasons, the they are not being used practically as the sensitive DC current sensor.

In the magnetic amplifier type and magnetic multivibrator type, as previously described, the core of soft magnetic material must be subjected to DC magnetic deflection by the DC current flowing through the lead wire being detected so as to saturate nearly to the saturated magnetic flux density (Bs), resulting in a low detecting sensitivity. And hence, in the case of using the well known soft magnetic material such as permalloy and the like as the core, for example, when the current flowing through the lead wire being detected is about several tens of mA, the lead wire being detected must be wound around the core of soft magnetic material by several tens to several hundreds of turns or more, thus it was difficult to use as the DC current sensor for the leakage breaker and the like where the lead wire being detected is required by one turn.

Also in the Hall device type, since the detecting capability is determined inevitably by the characteristic of the Hall device, when the Hall device which is known at present is used, for example, when the current flowing through the lead wire being detected is about several tens of mA, the lead wire being detected must be wound around the core of soft magnetic material by several hundreds to several thousands of turns or more, thus as same as the aforementioned magnetic amplifier type and magnetic multivibrator type, it was difficult to use as the DC current sensor of the leakage breaker or the like where the lead wire being detected is required by one turn.

SUMMARY OF THE INVENTION

It is an object of the present invention to provide a sensitive DC current sensor which solves the aforementioned problems, and has a good detecting capability against a DC leakage breaker and the like, particularly, even against a micro-current variation with a simple construction.

It is another object of the present invention to provide a sensitive DC current sensor, particularly, having a simply shaped detecting core constituting the DC current sensor and a high productivity.

In view of the fact that, when a lead wire being detected is extended through a detecting core consisting of an annular soft magnetic material, around which a detecting coil is wound in a toroidal shape, and a DC current is applied thereto, through a clockwise magnetic field is produced in a direction of the DC current and a magnetic flux $\Phi_0$ is produced in a detecting core, since the current flowing through the lead wire being detected is the DC current, the magnetic flux $\Phi_0$ is constant and an electromotive force is not produced in the detecting coil, we have studied to produce the electromotive force in the detecting coil, by forming a magnetic gap partially in the detecting core, which is open and close by a magnetic substance to form a magnetic switch, and changing (ON-OFF) the magnetic flux $\Phi_0$ against time by the magnetic switch.

Furthermore, as the result of various studies carried out for higher realization of the above-mentioned configuration, we have confirmed that the object can be achieved by, in place of the mechanical magnetic switch, disposing means for forming a magnetic gap periodically at a portion of the detecting core by a magnetic flux which is produced substantially in a orthogonal direction, against the magnetic flux produced in a circumferential direction in the detecting core by the DC current flowing through the lead wire being detected to realize, practically, the same action as the above-mentioned magnetic switch.

As a specific configuration, an excitation core consisting of an annular soft magnetic material connecting perpendicularly to the circumferential direction of the detecting core is disposed at a portion of the detecting core in a body, the detecting coil is wound around the detecting core in a toroidal shape, an excitation coil is wound around the detecting core in a circumferential direction thereof, and further, the excitation core is excited perpendicularly to the circumferential direction of the detecting core by applying the DC current to the excitation coil, and the intersection of the excitation core and the detecting core is magnetically saturated periodically to form a practical magnetic gap by the intersection which is magnetically saturated.

That is, since a relative permeability $\mu$ of the magnetically saturated intersection of the detecting core approaches to 1 endlessly, the magnetically saturated portion serves similarly as the magnetic gap and the magnetic flux $\Phi_0$ in the detecting core reduces at a constant period, and according to the variation of the magnetic flux, the electromotive force can be produced in the detecting coil.

We have made various improvements on a DC current sensor consisting of the above-mentioned basic configuration, particularly, in view of the shape of the core consisting of the soft magnetic material, the shape of the core is made simple as much as possible to suit for mass-production, and the excitation coil and detecting coil are disposed effectively in conformity with the core shape to accomplish the improvement of detecting sensitivity.

That is, the present invention is direct to a DC current sensor that, a hollow portion which communicates in the circumferential direction is formed in the detecting core consisting of the annular soft magnetic material, the excitation coil wound in the circumferential direction is disposed in the hollow portion, the detecting coil wound around the detecting core in a toroidal shape is disposed, and the lead wire being detected, through which the DC current for non-contact detection flows, is extended through the detecting core.

The present invention also provides a DC current sensor constituted such that, in the aforementioned configuration, the core can be divided, at least, at one place in the circumferential direction when the lead wire being detected is extended therethrough.

A DC current sensor of the present invention is that, by forming the hollow portion communicating in the circumferential direction in the detecting core consisting of the annular soft magnetic material, disposing thee excitation coil wound in the circumferential direction in the hollow portion, and disposing the detecting coil wound around the detecting core in a toroidal shape, the detecting core having an excellent productivity can be obtained.

Also, in addition to the construction of the detecting core, by disposing the excitation coil and detecting coil effectively, effects of a coercive force peculiar to the soft magnetic material constituting the detecting core and a leakage flux from the excitation coil can be considerably reduced, and the DC current sensor capable of detecting c microcurrent of, for example, about 5 mA or less very sensitively can be realized.

Accordingly, when used in a DC leakage breaker or the like, a required sensitive detection can be achieved just by extending a lead wire being detected through the detecting core, and since the construction is simple, the DC current sensor can be made smaller, and further, not only an absolute value of the DC current flowing through the lead wire being detected, but also its direction can be detected, thus the range of use can be more broadened.

BRIEF DESCRIPTION OF THE DRAWINGS

FIG. 9 is a graphs showing the relationship of an applied frequency in a DC current sensor configuration of FIG. 7, wherein A shows the relationship between the frequency and an excitation current, B shows that of the frequency and a magnetic flux passing through a detecting core, and C shows that of the frequency and an electromotive force of the detecting core.

DETAILED DESCRIPTION OF THE PREFERRED EMBODIMENTS

Details on Development of the Present Invention

In the following, the operation of a DC current sensor of the present invention is described in detail with reference to the drawings.

As previously described, the DC current sensor of the present invention has a basic core-shape construction, in which an excitation core consisting of an annular soft magnetic material connected in a perpendicular direction to a circumferential direction of a detecting core is disposed on a portion of the detecting core in a body, and has been accomplished by going through various improvements. The principle of operation is also substantially same as the case of DC current sensor having the above-mentioned basic construction, therefore, in the following description, first the principle of operation is described based on the DC current sensor having the above-mentioned construction, and further, the details on development of the present invention is described so that features of the DC current sensor of the present invention will become more clear.

Figure 7:
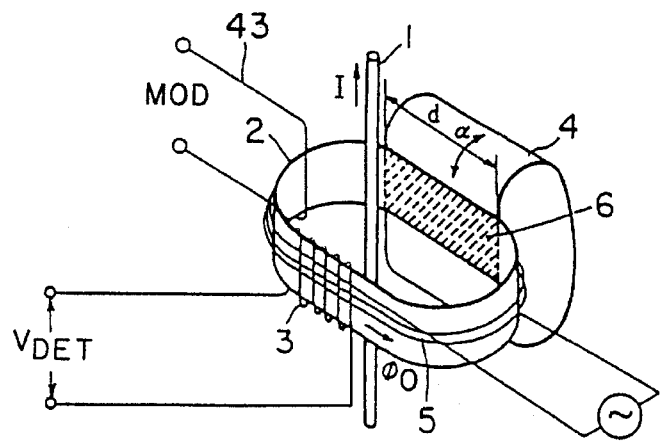
FIG. 7 is a perspective view showing an outline of a DC current sensor which has been developed before developing a DC current sensor of the present invention.
Figure 8A:
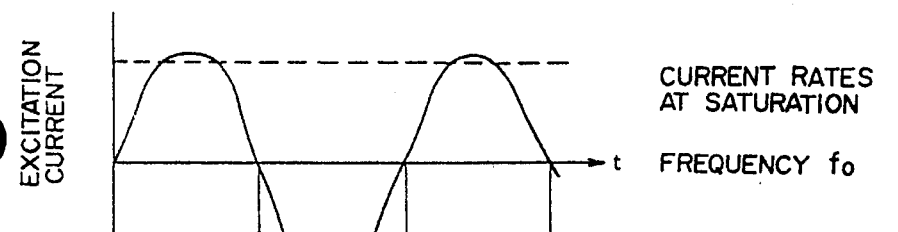
FIG. 8 is a graphs showing the relationship of an applied frequency in a DC current sensor configuration of FIG. 7, wherein A shows the relationship between the frequency and an excitation current, B shows that of the frequency and a magnetic flux passing through a detecting core, and C shows that of the frequency and an electromotive force of the detecting coil.

FIG. 7 is a perspective explanatory view for explaining the basic principle of operation of the DC current sensor of the present invention. FIG. 8 and FIG. 9 show the relationship between an excitation current and a magnetic flux passing through the detecting core, and further, an electromotive force produced in a detecting coil in this configuration.

In FIG. 7, a lead wire being detected 1 extends through the detecting core 2 consisting of an annular soft magnetic material. A detecting coil 3 is wound in a toroidal shape around a predetermined position of the detecting core 2, and is connected to a predetermined detecting circuit (not shown) as securing an electrical insulation with the lead wire being detected 1.

An excitation core 4 consists of an annular soft magnetic material and connected to a circumferential portion of the detecting core 2 in a perpendicular direction to a circumferential direction of the detecting core 2, and by the operation to be described later, forming a magnetically saturated portion at a core intersection 6 of the detecting core 2 and the excitation core 4 shown by oblique line. An excitation coil 5 is wound circumferentially around the detecting core 2.

In the figure, a modulation coil 43 is wound in the same direction as the lead wire being detected 1, for the purpose of reducing hysteresis of output characteristics assumed to be caused by an effect of magnetic characteristics (a coercive force) of the soft magnetic material constituting the detecting core 2.

In the configuration of FIG. 7, when a DC current I is applied to the lead wire being detected 1, a magnetic field which is in a clockwise direction to the direction of the DC current I is produced in the detecting core 2, producing a magnetic flux $\Phi_0$ in the detecting core.

At this time, when a predetermined AC current is applied to the excitation coil 5 to produce a magnetic flux, which changes periodically in a direction α in the figure, in the excitation core 4 and to magnetically saturate it periodically, a relative permeability μ of the core intersection 6 (shown by oblique lines in the figure), which is a circumferential portion of the detecting core 2, reduces and approaches to 1 endlessly to substantially from a so-called magnetic gap, reducing the magnetic flux $\Phi_0$ in the detecting core to $\Phi_1$.

Hereupon, when the AC current applied to the excitation coil 5 has a frequency $f_0$ and the excitation core 4 is saturated near a peak value of the current, the excitation core 4 is saturated twice in one period of the excitation current I, in the case where the DC current I flowing through the lead wire being detected 1 is in the positive direction (upward in the figure) as shown in FIG. 8, and in the case where the DC current I flowing through the lead wire being detected 1 is in the negative direction (downward in the figure) as shown in FIG. 9.

Figure 8B:
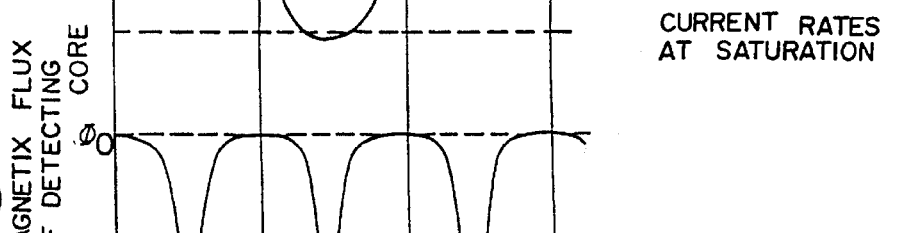
Figure 8C:
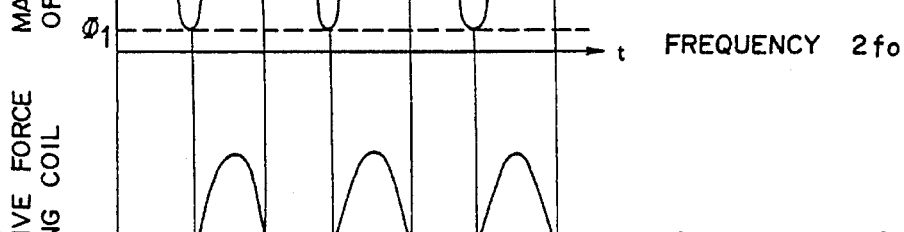

In the case where the DC current I flowing through the lead wire being detected 1 is in the positive direction (upward in the figure) as shown in FIG. 8, by this saturation, the magnetic flux $\Phi_0$ produced by the DC current I flowing through the lead wire being detected 1 produced in the detecting core 2 reduces to $\Phi_1$ at the frequency $2f_0$ as shown in FIG. 8(B). That is the modulation takes place at $2f_0$. Thus, as the magnetic flux changes as above the voltage $V_{DET}$ of frequency $2f_0$ is produced in the detecting coil 3.

Also in the case where the DC current I flowing through the lead wire being detected 1 is in the negative direction (downward in the figure) as shown in FIG. 9, though the operation is substantially same as the case where the DC current I is in the positive direction (upward in the figure), since the DC current I is in the opposite direction, the direction of the magnetic flux produced in the detecting core 2 is also opposite, and the phase difference of the voltage $V_{DET}$ of frequency $2f_0$ produced in the detecting coil 3 becomes 180 degree.

However, in spite of the direction of the DC current I flowing through the lead wire being detected 1, in either case, from the relation of magnetic flux $\Phi_0$ α Dc current I and voltage $V_{DET}$ α magnetic flux $\Phi_0$, voltage $V_{DET}$ α DC current I, thus the electromotive force proportional to the DC current I flowing through the lead wire being detected 1 can be detected by the detecting coil 3, and an absolute value of the DC current I flowing through the lead wire being detected I can be detected.

In the DC current sensor having the above-mentioned configuration, through the DC current can be detected by the relatively simple configuration as compared with the conventional configuration, particularly, in measurement of the micro-current region, since a reference level at measurement changes due to a hysteresis phenomenon of the output voltage (output characteristics) influenced by the coercive force of the detecting core 2, and the measurement value changes each time and an accurate value can not be obtained, as shown in FIG. 7, the modulation coil 43 wound in the same direction as the lead wire being detected 1 is disposed in the detecting core 2. That is, in the DC current sensor having the above-mentioned configuration, through the detecting core 2 itself is demagnetized by the excitation current (AC current) flowing through the excitation coil 5, because the excitation coil 5 is wound around the detecting core 2, it is not sufficient, in addition to the demagnetization effect, an alternating magnetic field produced in the modulation coil 43 is superposed on the detecting core 2 to reduce the output characteristic hysteresis due to the residual magnetic flux of the core.

Thus, when the AC current which is necessary to produce a magnetic field above the coercive force of the detecting core 2 is applied to the modulation coil 43, the hysteresis characteristic produced by the residual magnetic flux caused by the coercive force of the core material is eliminated, and the detecting sensitivity by the micro-current can be enhanced by removing the superposed alternating components in a detecting circuit.

As shown in FIG. 7, the modulation coil 43 is that, besides winding around the detecting core 2 in the same direction as the lead wire being detected 1 by one turn so as to extend through the detecting core 2, it is also wound around the detecting core 2 in the same direction as aforementioned by several turns depending upon the required intensity of the alternating magnetic field, particularly, in the case of winding several turns, it is wound around the detecting core 2 in a toroidal shape practically as same as the detecting coil 3.

Also, as it is apparent from FIG. 7, since the modulation coil 43 is wound around the detecting core 2 practically in the same direction and at the same location as the detecting coil 3 which is wound in the toroidal shape, it can be commonly used with the detecting coil 3.

That is, originally, the electric current flowing through the detecting coil 3 and that flowing through the modulation coil 43 have frequencies which differ largely, so that even they are used commonly, by suitably disposing a filter which passes the electric current having the frequency realizing respective functions, electric signals can be easily separated, and even when the modulation coil 43 and the detecting coil 3 are constructed in a body, the output characteristic hysteresis can be reduced.

Furthermore, since the phase difference of the voltage $V_{DET}$ of frequency $2f_0$ produced in the detecting coil 3 depending upon the direction of the DC current I flowing through the lead wire being detecting 1 is 180 degree as described in FIG. 8 and FIG. 9, by applying an excitation current in a state, where two times of the frequency of the excitation current from an oscillator to the excitation coil 5 beforehand is divided into half, and detecting the phase difference of an output of the oscillator and an output of the detecting coil 3 by a phase comparison circuit, an absolute value as well as the direction of the DC current flowing through the lead wire being detected 1 can be detected easily.

That is, since the frequency of the excitation current oscillated from the oscillator connected to the excitation coil 5 and that of the output $V_{DET}$ from the detecting coil 3 become the frequency $2f_0$ which is two times the excitation current applied finally to the excitation coil 5, the phase differences can be easily compared, and not only the absolute value of the DC current flowing through the lead wire being detected 1, but also its direction can be detected.

Figure 10:
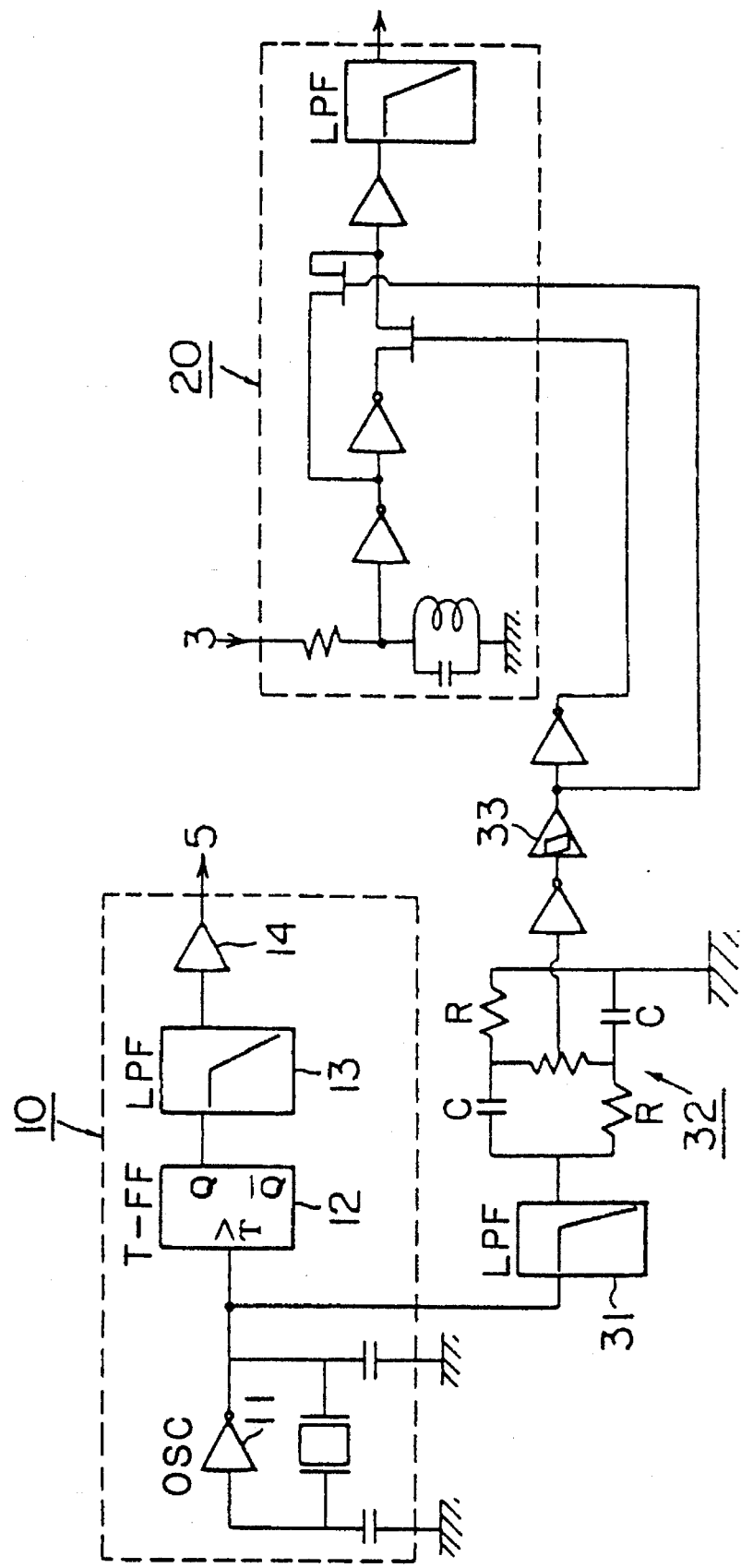
FIG. 10 is one embodiment of an electric circuit connected to a DC current sensor of FIG. 7.

For example, by connecting the electric circuit shown in FIG. 10 respectively to the excitation coil 5 and the detecting coil 3, the above-mentioned operation can be realized.

That is, as shown in FIG. 10, the excitation coil 5 is connected to AC current applying means 10. The AC current applying means 10 comprises, an OSC (oscillation circuit) 11 which oscillates the excitation current of frequency $2f_0$ which is two times the excitation current applied finally to the excitation coil 5, and a T-FF (trigger-flip-flop) 12 which divides the excitation current frequency into half, and connects the AC current whose frequency is once divided to $f_0$ from $2f_0$ to the excitation coil 5 via a LPF (low-pass filter) 13 and a buffer amplifier 14.

When the DC current I of predetermined direction is applied to the lead wire being detected (refer to FIG. 7), by the excitation current whose frequency $f_0$ is divided into half applied to the excitation coil 5, as same as a mechanism of producing the electromotive force previously described, a magnetic flux produced in the detecting core 2 is modulated, and the electromotive force of the frequency $2f_0$ of two times the excitation current proportional to the DC current I flowing through the lead wire being detected I can be outputted from the detecting coil 3, thereby an absolute value of the DC current I flowing through the lead wire being detected 1 can be known.

As already described in FIG. 8 and FIG. 9, the phase difference of voltage $V_{DET}$ of frequency $2f_0$ produced in the detecting coil 3 is 180 degree, depending upon the direction of the DC current I flowing through the lead wire being detected 1.

The output (electromotive force) of frequency $2f_0$ produced in the detecting coil 3 in such a manner is inputted to a phase comparison circuit 20 shown in FIG. 10.

Meanwhile, a portion of the excitation current of frequency $2f_0$ oscillated from the OSC 11 constituting the AC current applying means 10 is inputted to the phase comparison circuit 20 shown in FIG. 10 as keeping the frequency $2f_0$, via the LPF (low-pass filter) 3, a phase shifter 32, a Schmitt trigger 33 and so on without being connected to the excitation coil 5 via the T-FF 12 and so on.

Component parts used in the phase shifter 32 are preferably disposed so that their constants satisfy $f_{OSC}=1/2\Pi RC$.

The phase comparison circuit 20 detects the phase difference of the output from the OSC 11 inputted to the circuit 20 and that from the detecting coil 3, and finally outputs the direction corresponding to the direction of the DC current I flowing through the lead wire being detected 1 as well as the output voltage $V_{out}$ showing the absolute value of the direct current I in analog.

Also, by applying an electric current whose direction and intensity change linearly periodically against time such as the electric current, which changes in a triangular waveform, to the detecting coil 3, a deflection magnetic field may be given in the detecting core 2 and the absolute value as well as the direction of the DC current flowing through the lead wire being detected 1 can be detected easily.

That is, when the electric current such as that changes into a triangular waveform is applied to the detecting coil 3 in the state where the DC current flows through the lead wire being detected 1, in the detecting coil 3, a magnetic flux produced by the triangular waveform current and a magnetic flux produced by the DC current flowing through the lead wire being detected 1 are superposed, thus by phase detection of the output after applying a crest restriction to the electromotive force produced in the detecting coil 3, and detecting the time ratio (duty ratio) of an output time on the positive side (+) and an output time on the negative side (−), an absolute value as well as the direction of the DC current flowing through the lead wire being detected 1 can be detected. Particularly, when a maximum value of the electric current applied to the detecting coil 3 is set highly enough to produce a magnetic field above the coercive force (±Hc) of the material of the detecting core 2, the output characteristic hysteresis caused by the hysteresis of the material of the detecting core 2 an practically be reduced.

Furthermore, by combining various known electric circuits effectively, essential advantages of the DC current sensor constituted as shown in FIG. 7 can be utilized more effectively.

Meanwhile, by adopting the configuration shown in FIG. 7 as the basic configuration, and particularly, by improving the Configuration of the detecting core and the excitation core, an electromagnetic unbalance and the like as the DC current sensor is reduced, thereby noises can be reduced and an S/N ratio can be improved.

Figure 11:
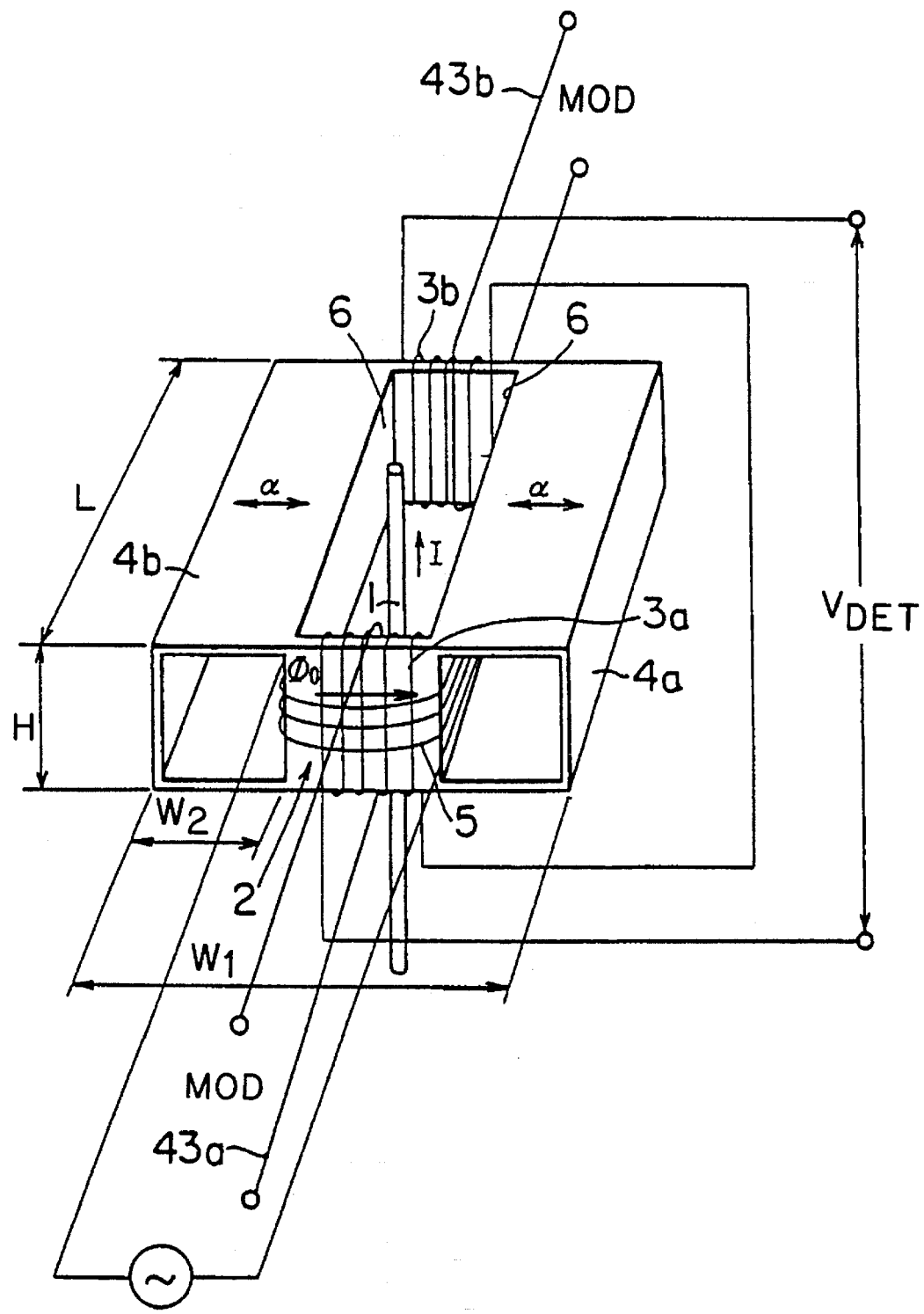
FIG. 11 is a perspective view showing outline of another DC current sensor which has been developed before developing a DC current sensor of the present invention.

For example, the DC current sensor constituted as shown in FIG. 11 includes the aforementioned effects and is effective in realizing the stable measurement.

That is, in the configuration shown in FIG. 7, since one excitation core 4 is connected to the detecting core 2 an the detecting coil 3, excitation coil 5 and modulation coil 43 are disposed respectively at one location, though it is difficult to balance electromagnetically as the DC current sensor shown, the DC current sensor shown in FIG. 11 is constituted by considering the electromagnetic balance of the excitation core 4, detecting coil 3, excitation coil 5 and modulation coil 43.

In FIG. 11, a lead wire being detected 1 is extended through the center of the rectangular frame-shaped detecting core 2. On respective opposite long sides of the rectangular frame-shaped detecting core 2, a pair of excitation cores 4a and 4b are disposed in a body so as to form a quadrangular cylinder. Meanwhile, the excitation coil 5 is wound in a circumferential direction around the rectangular frame-shaped detecting core 2.

Around respective opposite short sides of the rectangular frame-shaped detecting core 2, a pair of detecting coils 3a and 3b are wound in a toroidal shape and are interconnected electrically. Furthermore, a pair of coils 43a and 43b are wound around the same location in the same direction as the lead wire being detected 1, and are connected electrically in series by predetermined means.

When the DC current I is applied to the lead wire being detected 1 in such a configuration, a magnetic field which is clockwise relative to the direction of the DC current I is produced in the detecting core 2, producing a magnetic flux therein.

At this time, when a predetermined AC current is applied to the excitation coil 5 to produce a magnetic flux, which changes periodically in a direction a in the figure, in the pair of excitation cores 4a, 4b and to magnetically saturate the excitation cores 4a and 4b periodically, a core intersection 6 of the long sides, which is a circumferential portion of the rectangular frame-shaped detecting core 2, substantially forms a so-called magnetic gap whose relative permeability p approaches very close to 1, and the magnetic flux $\Phi_0$ in the detecting core reduces to $\Phi_1$.

Thus, in the DC current sensor shown above, a mechanism of producing the electromotive force to the pair of detecting coils 3a and 3b is same as the configuration shown in FIG. 7, and the effects according to this mechanism can be obtained similarly. Furthermore, in this configuration, not only the electromagnetic balancing effect due to the entire symmetrical configuration against the lead wire being detected 1, besides the effect of disposing the pair of modulation coils 43a and 43b, it is effective in reducing a residual magnetic flux density in the detecting core 2 according to the diamagnetic effect obtained by increasing a ratio of width d (refer to FIG. 7) of the connection of the excitation core 4 against a magnetic path length of the detecting core 2, thus the effect of coercive force of the core material can be reduced further.

By the DC current sensor constituted as shown in FIG. 11, though it was possible to provide the DC current sensor which is relatively simple in construction and capable of detecting an electric current in a micro-region at a high sensitivity, as compared with the DC current sensor consisting of the conventionally known magnetic amplifier type, magnetic multivibrator type, Hall device type or the like, in order to improve the productivity in mass-production in an industrial scale, the entire construction of the DC current sensor must be simplified further particularly, a shape of the core must be improved.

In the configuration shown in FIG. 11, second higher harmonious of the excitation signal produced by a non-linearity of magnetic characteristics peculiar to the soft magnetic material consisting the detecting core 2 and the excitation cores 4a and 4b, is mixed into the detecting coil 3a, and besides, since the second higher harmonics and the detecting signal (electromotive force of the detecting coil 3a) have the same frequency, it is impossible to separate them electrically.

Thus, it was difficult to provide the DC current sensor having an S/N ratio higher than that.

As it is apparent from details of the various improvements described heretofore, the DC current sensor of the present invention has the basic configuration as shown in FIG. 7, later the configuration shown in FIG. 11 in which the electromagnetic balance is considered and its weak points are improved has been developed, and in order to solve the aforementioned problems, more improvements were added thereto, namely, the DC current sensor of the present invention has been developed by mainly devising a shape of the core, or forming a hollow portion extending in a circumferential direction through the detecting core consisting of the annular soft magnetic material, disposing the excitation coils wound in a circumferential direction in the hollow portion and disposing the detecting coil which is wound in a toroidal shape around the detecting core. The specific configuration is described in detail by the embodiments shown in the following.

Operation of a DC Current Sensor according to the Present Invention

Figure 1:
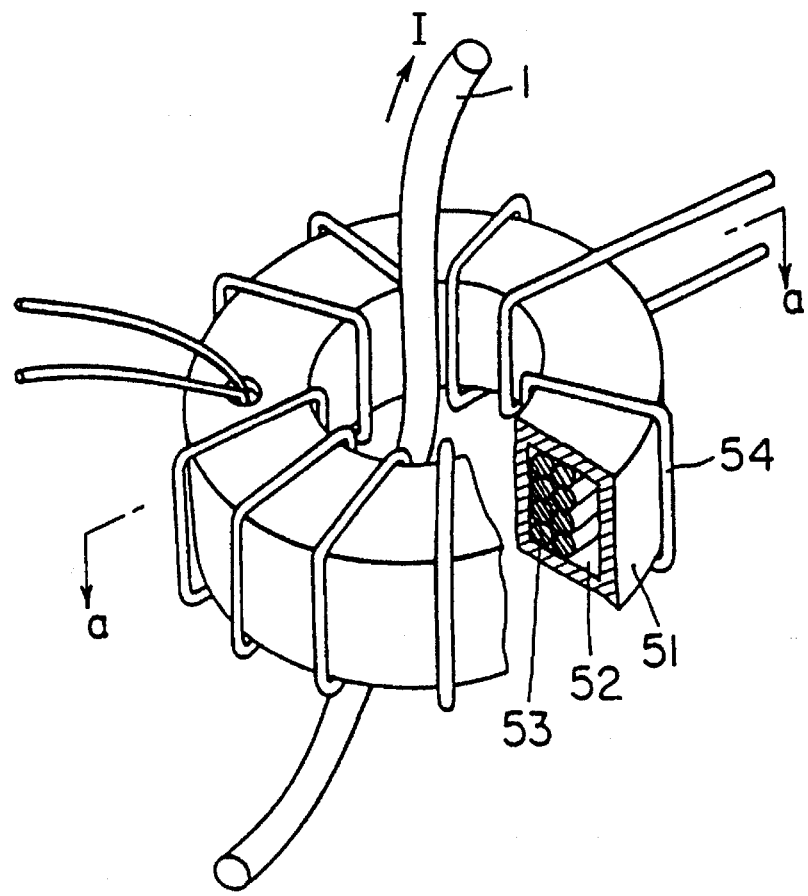
FIG. 1 is a fragmentary sectional perspective view showing an outline of one embodiment of a DC current sensor of the present invention.
Figure 2:
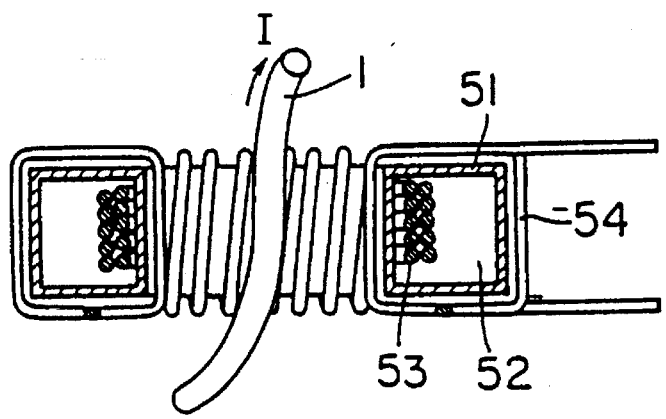
FIG. 2 is a longitudinal sectional view taken along a line a—a of a DC current sensor of FIG. 1.
Figure 3:
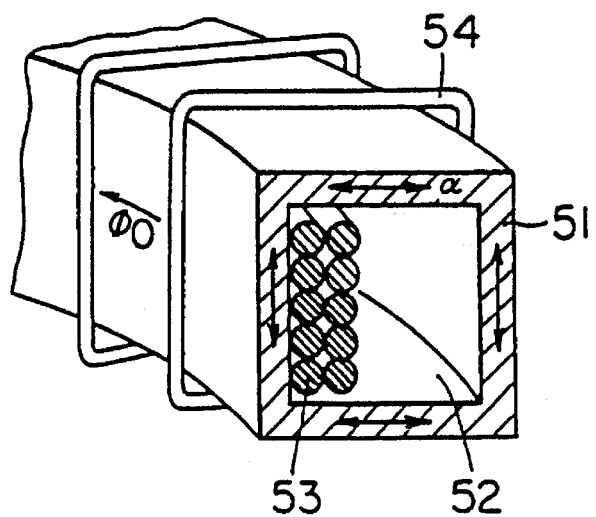
FIG. 3 is a detailed fragmentary longitudinal sectional explanatory view of a DC current sensor of FIG. 1.

FIG. 1 is a perspective fragmentary sectional view showing one embodiment of a DC current sensor of the present invention, FIG. 2 is a longitudinal sectional view taken along a line a—a of FIG. 1, and FIG. 3 is a fragmentary detailed longitudinal sectional view of FIG. 1.

In the figure, a lead wire being detected 1 is extended through an entirely annular detecting core 51. The detecting core 51 is provided with a hollow portion 52 which extending through in a circumferential direction by combining a plurality of detecting core members to be described later, and is formed into a so-called tubular shape.

In the figure, numeral 53 designates an excitation coil which is wound in a circumferential direction in the hollow portion of the detecting core 51, and numeral 54 designates a detecting coil which is wound in a toroidal shape around the detecting core 51.

In the DC current sensor of the present invention, as the configuration previously shown in FIG. 7 and FIG. 11, it is difficult to clearly distinguish component parts of the detecting core and the excitation core, and as to be described later, the detecting core 51 serves the same function as the detecting core 2 and the excitation core 4 having the configuration shown in FIG. 7 and FIG. 11 serve.

In the configuration shown above, when a DC current I is applied to the lead wire being detected 1, as shown in FIG. 3, a magnetic flux $\Phi_0$ is produced in a circumferential direction of the detecting core 51. When a predetermined excitation current (AC current) is applied to the excitation coil 53 in this state, a magnetic flux is produced in a direction shown by the arrow α in the detecting core 51. The magnetic flux in the direction α is produced substantially in the orthogonal direction against the magnetic flux $\Phi_0$ in the circumferential direction produced by the DC current flowing through the lead wire being detected 1, and periodically interrupts a magnetic path by the magnetic flux $\Phi_0$.

That is, by a mechanism of producing an electromotive force which is basically same as the DC current sensor constituted as shown in FIG. 7 and FIG. 11 previously described, a desired output can be obtained in the detecting coil 54.

However, though such a phenomenon, or the phenomenon of periodically interrupting the magnetic path by the circumferential magnetic flux $\Phi_0$ is produced at a portion (portion indicated at numeral 6 in respective figures) of the detecting core 2 in the configuration of FIG. 7 and FIG. 11 previously described, in the DC current sensor of the present invention, it is produced entirely in the detecting core 51.

Thus, demagnetization effects of the detecting core 51 by the excitation current (AC current) applied to the excitation coil 53 is largely improved, and further, by using commonly with the modulation coil (refer to FIG. 7 and FIG. 11) previously described, the output characteristic hysteresis effected by a coercive force peculiar to the detecting core 51 can be largely reduced, and a high sensitive measurement can be accomplished in detecting the micro-current.

That is, since magnetic saturation is produced periodically all around in the circumferential direction and the perpendicular direction (direction $\alpha$ in the figure) of the detecting core 51 by the excitation current applied to the excitation coil 53, the residual magnetic flux in the circumferential direction (direction $\Phi_0$ in the figure) is extinguished by the saturation. By such phenomenon, even when the material having a limited coercive force is used as the detecting core 51, the effect of magnetic hysteresis of the material is reduced considerably.

Also, since the excitation coil 53 is disposed in the hollow portion 52 in the detecting core 51, practically the excitation coil 53 is surrounded by the soft magnetic material, thus leakage of the magnetic flux produced by the excitation current flowing through the excitation coil 53 is very small, and a mixing level of the excitation signal into the detecting coil 54 can be lowered, as the result, the residual signal produced in the detecting coil 54 becomes smaller and an S/N ratio of the detecting signal can be largely improved.

Meanwhile, since the detecting core 51 can be obtained by combining and integrating detecting core members consisting of the simple configuration as shown in the embodiment to be describe later, for example; the detecting core members can be obtained simply by press molding and the like, thus it is very effective in mass-production in an industrial scale.

Figure 4:
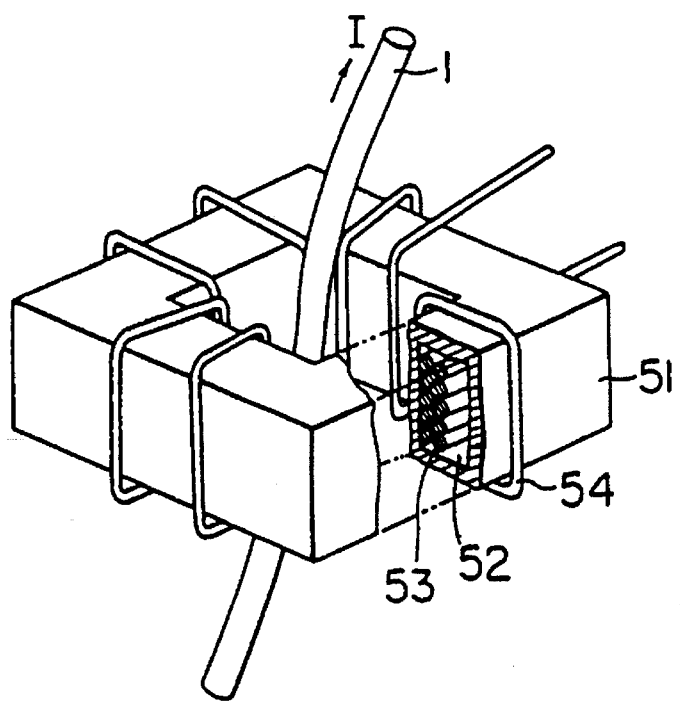
FIG. 4 is a fragmentary sectional perspective view showing an outline of another embodiment of a DC current sensor of the present invention.

FIG. 4 is a fragmentary sectional perspective view showing another embodiment of the DC current sensor of the present invention, wherein the basic configuration is as same as the configuration shown in FIG. 1 except a shape of the detecting core 51. That is, in the configuration shown in FIG. 1, though the detecting core 51 takes the form of cylindrical shape as a whole, in the configuration shown in FIG. 4, the detecting core 51 takes the form of quadrangular cylinder as a whole. These configurations may be selected suitably taking into consideration of the location where the DC current sensor is installed and the productivity.

Various configurations may be adopted in the DC current sensor of the present invention within the scope of appended claims, without being restricted to the configurations shown in FIG. 1 and FIG. 4.

For example, in the configurations shown in FIG. 1 and FIG. 4, though the location of the modulation coil 43 disposed in the configuration of FIG. 7 and FIG. 11 is not shown, in either of the configurations shown in FIG. 1 and FIG. 4, the same effect can be obtained by disposing the modulation coil 43, and even when adopting the configuration in which the modulation coil 43 and the detecting coil 54 are used commonly in a body, the output characteristic hysteresis can be reduced.

Also, in order to detect the absolute value as well as the direction of the DC current flowing through the lead wire being detected 1 simply as same as the configuration of FIG. 7 and FIG. 11, the excitation current in the state, where the frequency of the excitation current oscillated from an oscillator at the frequency of two times the excitation current beforehand is divided into half, is applied to the excitation coil 53, or means for detecting the phase difference of an output of the oscillator and that of the detecting coil by a phase comparison circuit is adopted, or an electric current whose direction and intensity change linearly periodically against time such as the electric current which changes in a triangular waveform is applied to the detecting coil 54, and means for providing a deflection magnetic field in the detecting core may be adopted, and further, by combining various known electric circuits effectively, essential advantages of the DC current sensor of the present invention can be utilized more effectively.

In the DC current sensor*of the present invention, as the annular soft magnetic material constituting the detecting core 51, it is preferable to select the soft magnetic material responsive to the intensity of electric current flowing through the lead wire being detected or the detecting sensitivity required for the sensor. Usually, though permalloy is preferable when considering the magnetic characteristics and workability, other known soft magnetic materials such as a silicon steel plate, amorphous, electromagnetic soft iron, soft ferrite and the like may be used independently or in combination.

The annular soft magnetic materials need not be a so-called ring shape, they may be connected to form an electromagnetically closed circuit, particularly, as far as it is constituted to form a hollow portion communicating through the detecting core in a circumferential direction and to dispose the excitation coil wound in the circumferential direction in the hollow portion, various configuration which are in a cylindrical shape a quadrangular shape and the like as a whole may be adopted.

Productivity can be improved considerably by taking into consideration of the quality of the magnetic material and the final shape of the detecting core previously described, and selecting the number of members constituting the detecting core and a processing method. For example, in the case of metal materials such as permalloy and the like, mechanical processings by a press or a lathe can be suitably combined, and in the case of soft ferrite, press molding can be adopted to obtain the detecting core members of desired shapes easily.

In the DC current sensor of the present invention, with respect to magnetic saturation in the detecting core 51, it is not necessary to accomplish the complete saturation throughout the detecting core 51, the required detection can be accomplished by just saturating roughly.

Thus, by selecting the optimum condition on shapes and sizes of the soft magnetic material and the number of turns of the detecting coil and the excitation coil, together with the quality of the soft magnetic materials, it is possible to provide a sensor having a higher availability.

Also, by surrounding the DC current sensor of the present invention with a shield case consisting of permalloy, non-oriented silicon steel plate and the like, it is possible to prevent external induction noises, results in a more stale detection.

In either of the aforementioned configurations, the lead wire being detected extended through the detecting core is not restricted to one, a plurality of lead wires may be employed responsive to the size of the required sensor. However, the effect of the DC current sensor of the present invention can be realized most effectively by employing one lead wire being detected.

DC Current Sensor Which can be Divided

Furthermore, as a configuration of the DC current sensor which is very easy to mount on a lead wire being detected which has been wired already and has a high versatility, the DC current sensor which can be divided, at least, at one location in a circumferential direction when extending the lead wire being detected through the core, is proposed.

An example shown in FIG. 12, in which a ring-shaped detecting core 62 is divided into half, is constituted as follows; a single turn excitation coil is formed in semicircular detecting core members 62a, 62b forming a body of the detecting core 62 which is shaved out from a soft magnetic material block, for example, semicircular excitation coil members 65a, 65b (where, only 65b is not shown) formed by processing a Cu block material are inserted, then assembled in a ring shape by placing semicircular plates 66a, 66b made of soft magnetic material and forming the inner surface of the detecting core 62, then clamped by a clamp band 67 contacting to the outer surface of the core, and further, tightening projections 68a, 68b are provided on one end face of the semicircular excitation coil members 65a, 65b so as to be tightened by a bolt extending therethrough, on another end face, a screw 69 which is inserted from the outside of the core (refer to a screw hole 62c open in the detecting core member 62a) is provided to tighten the semicircular excitation coil members 65a, 65b, thereby a pair of semicircular excitation coil members 65a, 65b are tightened firmly.

In order to secure insulation between the component members 62a, 62b, 66a, 66b of the detecting core 62 and the semicircular excitation coil members 65a, 65b, for example, besides interposing an insulation plate 68c between one butt contact of the coil members 65a, 65b, an insulation substance is coated on the surface of the coil members 65a, 65b except the butt contact.

Detecting coils 63a, 63b are wound around the assembled semicircular detecting core, the excitation coil being energized between the tightening projections 68a, 68b.

In this configuration, since the excitation coil is practically one turn, by exciting the vicinity of the tightening projections 68a, 68b via an impedance matching transformer, the operation effect as same as the configuration of FIG. 1 can be obtained.

Figure 12A:
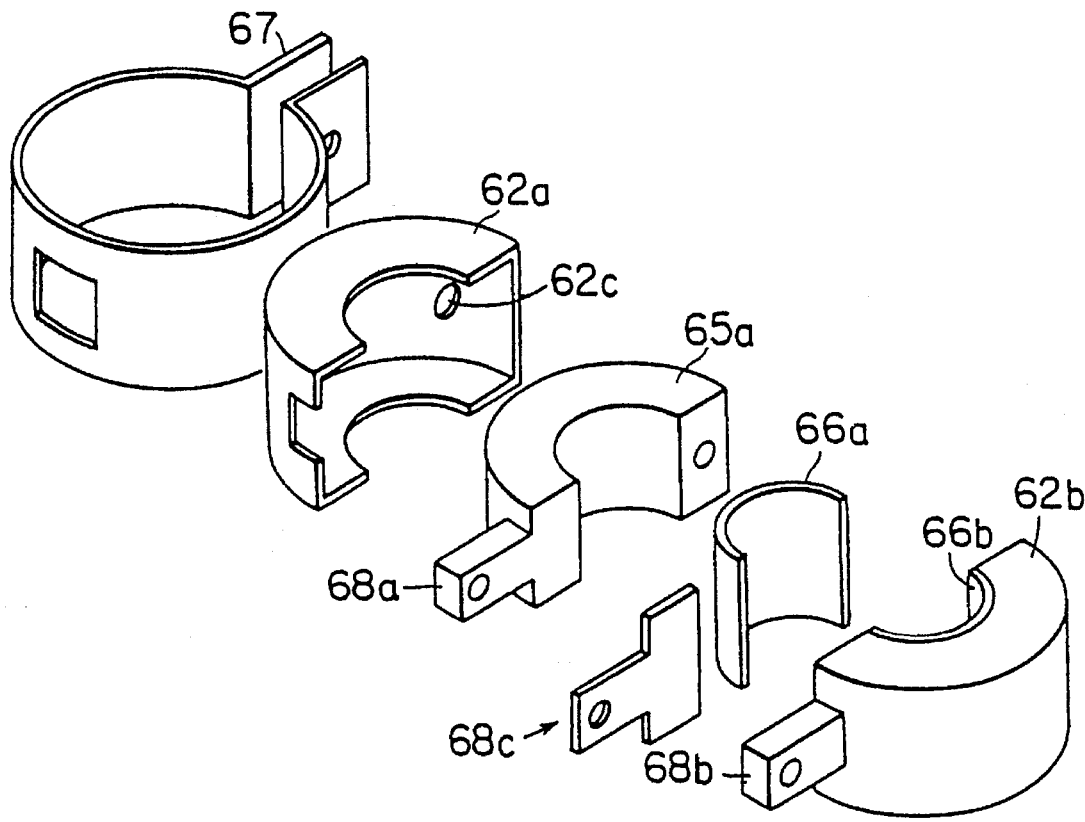
FIG. 12(A) is an exploded perspective view of a disassemble-type DC current sensor according to the present invention.
Figure 12B:
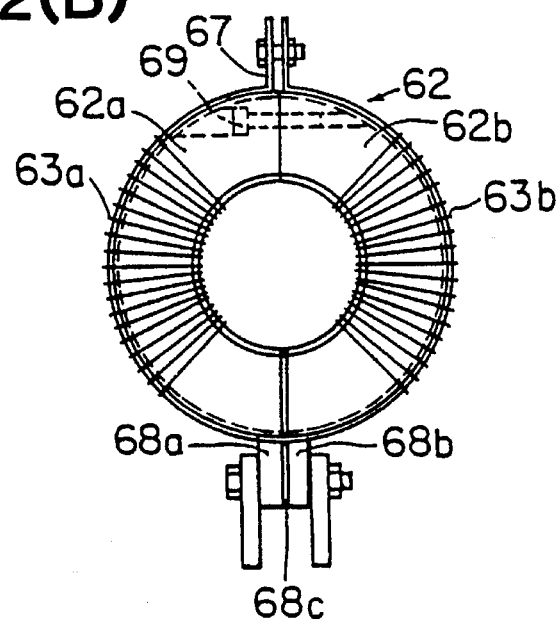
FIG. 12(B) is an upper view thereof.

In the configuration of FIG. 12, though a contact surface of the semicircular excitation coil members 65a, 65b constituting the excitation coil is large enough to realize the required excitation effect, since a contact surface with the detecting core members 62a, 62b constituting the detecting core 62 is small, it is difficult to reduce a magnetic resistance, deteriorating the detecting sensitivity. As a configuration derived from improving the configuration shown in FIG. 12, a DC current sensor shown in FIG. 13 is proposed.

Figure 13A:
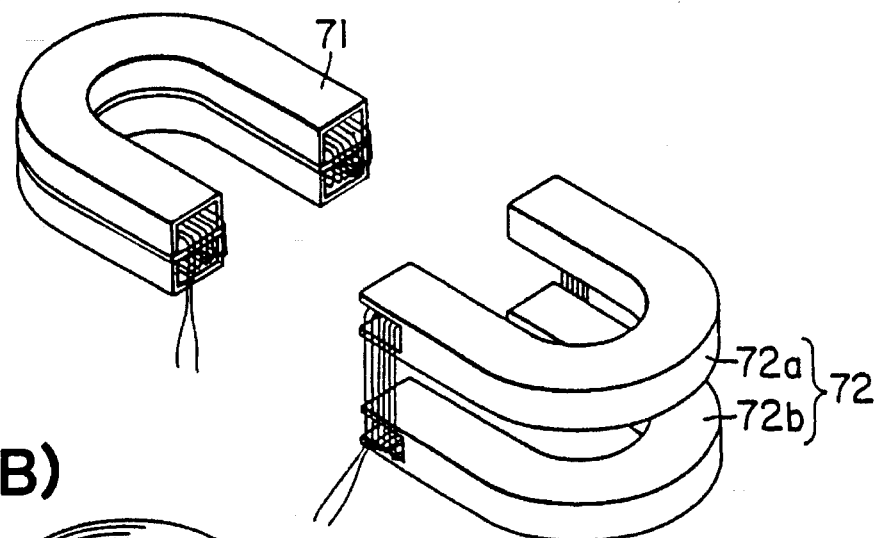
FIG. 13 is an exploded perspective view of a disassemble-type DC current sensor according to the present invention, wherein A shows a core, B shows an excitation coil and C shows an entire view.
Figure 13B:
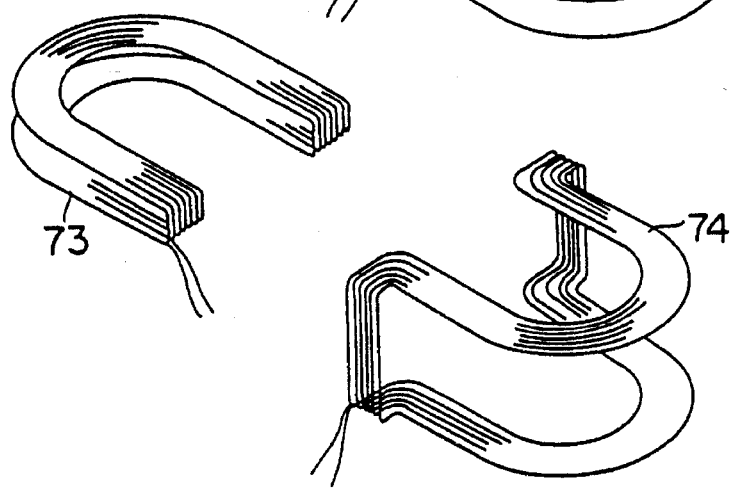
Figure 13C:
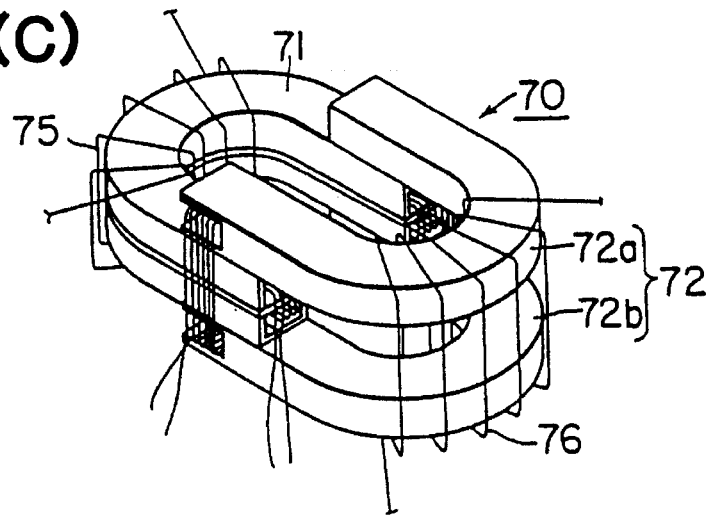

An example shown in FIG. 13 is constituted by using a cylindrical core which is divided into half. The detecting core 70 is formed into an elliptical shape by combining horseshoe-shaped detecting core members 71, 72, the horseshoe-shaped detecting core member 71 on the left hand side in the figure is an integrated-type detecting core member constituted by laminating a pair of horseshoe-shaped cylinders vertically in a body, in the figure, the cylinders which are divided into upper and lower sections by a partition plate are formed into a horseshoe shape, and hereupon, though it is formed with a pair of U-shaped materials in cross section and the partition plate, an excitation coil 73 formed by bending an elliptical coil as shown in FIG. 13 (B) is incorporated therein.

Another horseshoe-shaped detecting core member 72 is the separate-type detecting core member constituted by a pair of horseshoe-shaped cylinders forming a predetermined gap therebetween. In the figure, a pair of detecting core members 72a, 72b formed with U-shaped groove members in cross section and cover plate members are disposed in parallel, and an excitation coil member 74 formed by bending an elliptical coil as shown in FIG. 13(B), a bent portion positioning at an outer portion of the assembled detecting core 70, is incorporated therein so as to be clamped by the pair of detecting core members 72a, 72b at the time of butting against the horseshoe-shaped detecting core member 71 in a body.

In the figure, a detecting coil portion 75 wound in a toroidal shape around the integrated-type detecting core member 71, and numeral 76 designates a detecting coil portion wound in a toroidal shape around the separate-type detecting core member 72.

In the pair of U-shaped material and the partition plate of the horseshoe-shaped detecting core member 71, a thickness of the partition plate is preferably about two times the U-shaped material. By arranging a non-magnetic hold member (not shown) of a predetermined size between the detecting core members 72a, 72b of the horseshoe-shaped detecting core member 72, integration with the detecting core member 71 is facilitated and more convenient handling can be effected.

As such, by employing the configuration, in which the excitation coil is wound independently without being disposed across the divided detecting cores, it is not necessary to connect the excitation coil in the detecting core for integration.

That is, by partitioning a hollow portion of the divided detecting core member 71 with a same material as the core into two sections or more, and winding the excitation coil 73 in the divided hollow portions, as same as the excitation coil 53 shown in FIG. 1, the detecting core member 71 can be magnetically saturated periodically throughout the circumferential direction and the orthogonal direction of the longitudinal direction.

Also in the detecting core members 72a, 72b, by the excitation coil 74 wound in the hollow portions, the core members 72a, 72b can be magnetically saturated periodically throughout as same as the detecting core member 71.

Meanwhile, in this configuration, by inserting and clamping one detecting core member 71 between other detecting core members 72a, 72b so as to be tightened vertically for integration, a magnetic resistance at the contact portion can be reduced.

That is, it is possible to increase the overlapping and contact area of the detecting core members 71, 72, and as compared with the configuration of FIG. 12, the magnetic resistance at the contact portion is considerably reduced and the detecting sensitivity as about same as the case of using the integrated core shown in FIG. 1 can be obtained.

The separated-type DC current sensor shown above is very simple to mount to a lead wire being detected wired already and its versatility is high, thus the same operation effect as the integrated type previously described is accomplished, and the configuration for dividing the core other than the aforementioned configuration can be suitably employed.

EMBODIMENT 1

Figure 5A:
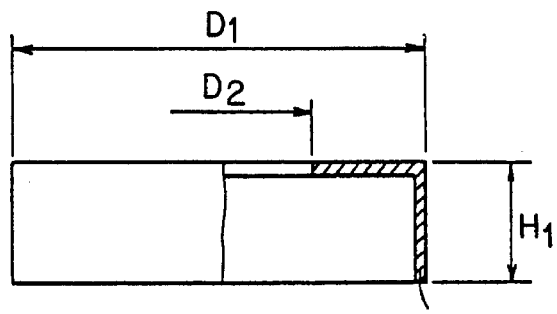
FIG. 5 is a longitudinal sectional view of a detecting core member constituting a detecting core and a coil bobbin, around which an excitation coil is wound, of a DC current sensor of FIG. 1.
Figure 5B:
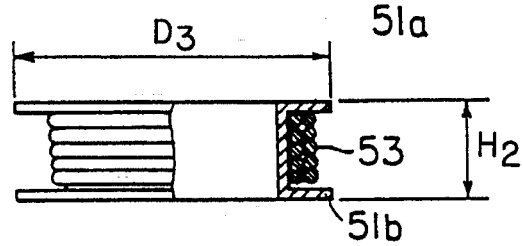
Figure 5C:
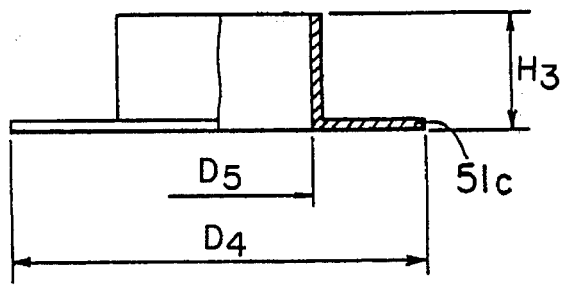

The detecting core members 51a, 51b shown in FIG. 5(A) and FIG. 5(C) were shaved from a block material consisting of permalloy C (78% Ni-5%Mo-4%Cu-balFe) and processed into a mould. Thickness of the resulting members 51a, 51c was 1.0 mm.

The detecting core member 51a has a cylindrical shape with bottom and includes a through hole in the center of the bottom to constitute an external cylinder portion of the detecting core 51, and the detecting core member 51c has a collar around one end portion of the cylinder to constitute a inner cylinder portion of the detecting core 51. Where, rough sizes of the respective parts are that, in the detecting core member 51a, outside diameter $D_1=20$ mm, inside diameter $D_2=10$ mm and height $H_1=9$ mm, and in the detecting core member 51c, outside diameter $D_4=20$ mm, inside diameter $D_5=10$ mm and height $H_3=9$ mm.

The detecting core members 51a and 51c were subjected to heat treatment for multi-stage cooling at 100° C./hour between 600° C. and 400° C., after processing and heating in a hydrogen gas atmosphere at 1100° C. for 3 hours.

After winding the excitation coil 53 consisting of an enamel wire of 0.2 mm outside diameter around a plastic bobbin 51b of outside diameter $D_3=15$ mm and height $H_3=7$ mm shown in FIG. 5(B) by 100 turns, the plastic bobbin 51b was fit around the detecting core members 51c and covered with the detecting core members 51a for integration. That is, the detecting core 51 incorporating the plastic bobbin 51b, around which the excitation coil 53 is wound, was constituted by the detecting core member 51a and the detecting core member 51c.

After containing the detecting core 51 is a plastic case (not shown) and securing an electrical insulation, the detecting coil 54 consisting of an enamel wire of 0.1 mm outside diameter was wound around the plastic case (detecting core 51) in a toroidal shape by 300 turns as shown in FIG. 1, and the vinyl coated lead wire being detected 1 of 8 mm outside diameter was extended through the detecting core 51 to complete the DC current sensor of the present invention shown in FIG. 1.

Figure 6:
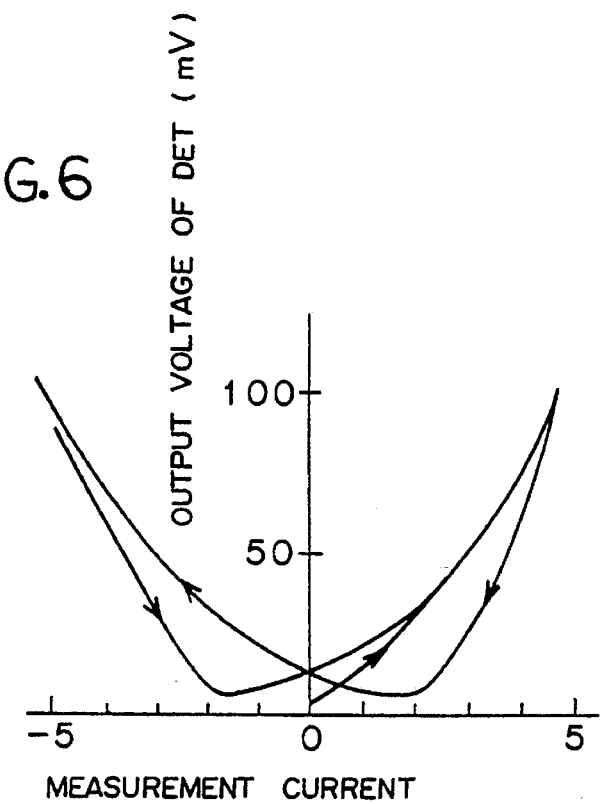
FIG. 6 is a linear graph showing the relationship between a DC current (micro-region) flowing through a lead wire being detected 1 and an output in a DC current sensor of FIG. 1.

In the DC current sensor of the present invention constituted as above, when an AC signal of $f_0=500$ Hz and 1 Vrms was applied to the excitation coil 53, an excitation current of 0.1 Arms was produced. At this time, when a micro-current of ±5 mA was applied to the lead wire being detected 1 to measure the AC current of $f=1000$ Hz ($f=2f_0$) produced in the detecting coil 54, a detection result as shown in FIG. 6 was obtained.

Since the configuration shown in FIG. 5 was shaved out from a block material for processing, the core thickness or the section area is large and it is effective in increasing a magnetic flux in the core and the output.

EMBODIMENT 2

Using the DC current sensor of Embodiment 1, AC current applying means provided with an oscillator producing an excitation current having a frequency of two times the excitation current applied finally to the excitation coil 53, and a phase comparison circuit are disposed perspectively on the excitation coil 53 and the detecting coil 54 to apply the practically same excitation signal as the Embodiment 1 from the oscillator to the excitation coil 53, and to apply a sine-wave Ac current of 30 Hz, 0.1 mA (at peak) so that the detecting coil 54 serves as the excitation coil, and further, an output variation after removing an alternating component of 30 Hz by a low-pass filter from an electromotive force (output) of the detecting coil 3 outputted via the phase comparison circuit, when the DC current I was applied to the lead wires being detected 1 in a range of ±5 mA, was measured. As a result, it has been confirmed that 1 mA can be detected at an S/N ratio of 10 or higher.

As it is apparent from the above measurement result, according to the DC current sensor of the present invention, in spite of the very simple configuration of the detecting core 51, an error output due to reciprocating currents is very small, and even with a micro-current of 1 mA, it can be measured at the S/N ratio of ten times or more, thus a very sensitive detection is possible.

EMBODIMENT 3

Figure 14A:
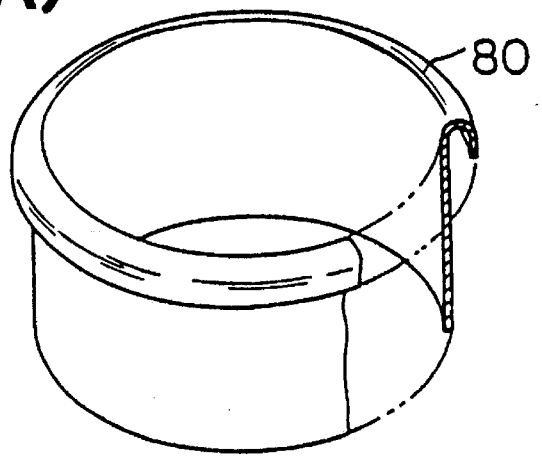
FIGS. 14(A), (B) and (C) are exploded perspective views of a DC current sensor of the present invention.

As shown in FIG. 14(A) and (C), plates made of permalloy C(78Ni-3.5Mo-4.5Cu-Fe) material of 0.35 mm thick were bent outwardly and inwardly by press molding respectively at one end to prepare an inner cylinder 80 and an outer cylinder 81 which were assembled together to form a cylinder, which was annealed to secure magnetic characteristics after washed in triclene, then heated in $H_2$ gas at 1000° C. for 3 hours and cooled at 100° C./hour between 600° C. and 400° C.

Figure 14B:
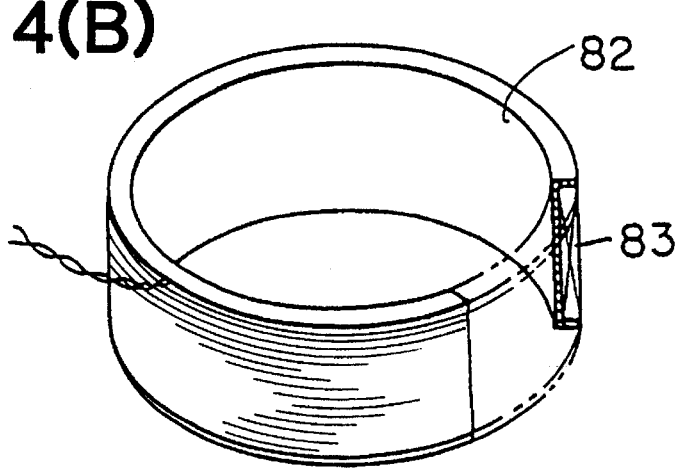

Also, as shown in FIG. 14(B), an enamel wire of 0.18 mm diameter was wound by 100 turns around a plastic bobbin 82 of 25.5 mm inside diameter, 0.2 mm thick and 7 mm long in a solenoid fashion to prepare an excitation coil 83 by impregnating instantaneous adhesives which is commercially available to solidify the wire.

Figure 14C:
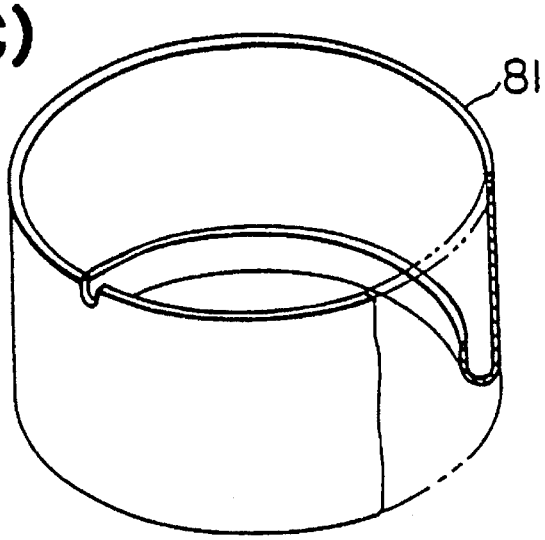
Figure 15A:
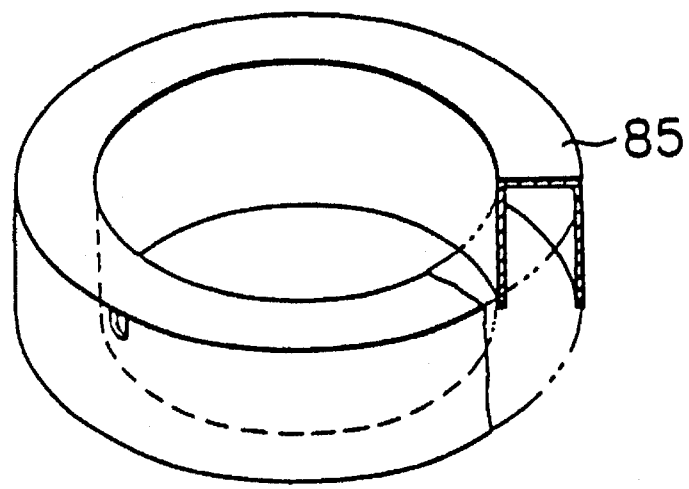
FIGS. 15(A), (B) and (C) are exploded perspective view of a DC current sensor of the present invention.
Figure 15B:
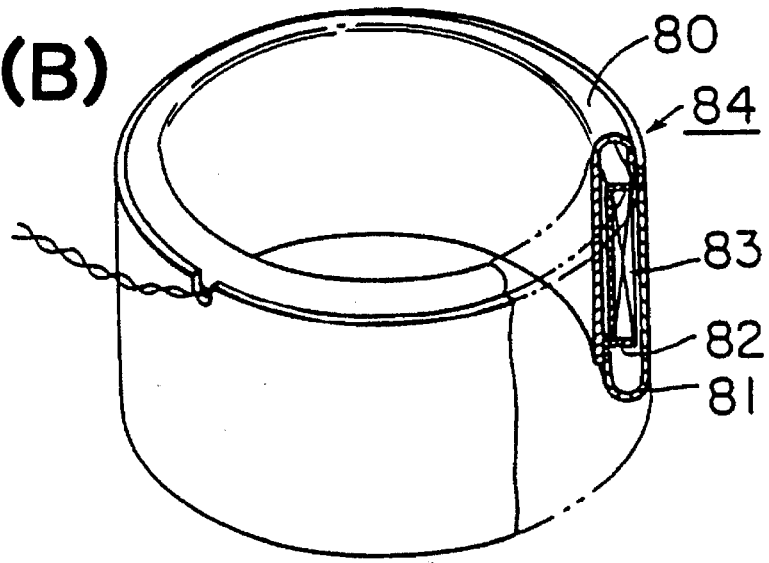
Figure 15C:
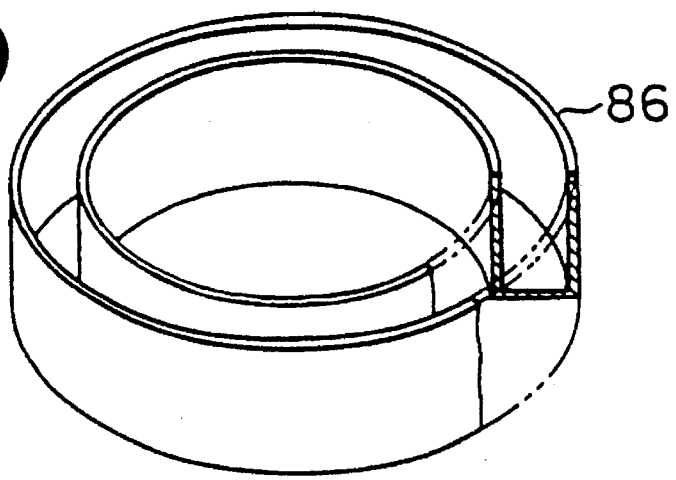

As shown in FIG. 14, the inner cylinder 80 and the outer cylinder 81 were inserted into the excitation coil 83 from the upper and lower sides for engagement to prepare a detecting core 84 incorporating the excitation coil 83 as shown in FIG. 15(B). The contact of the inner cylinder 80 and the outer cylinder 81 was secured by the instantaneous adhesives commercially available.

Figure 16:
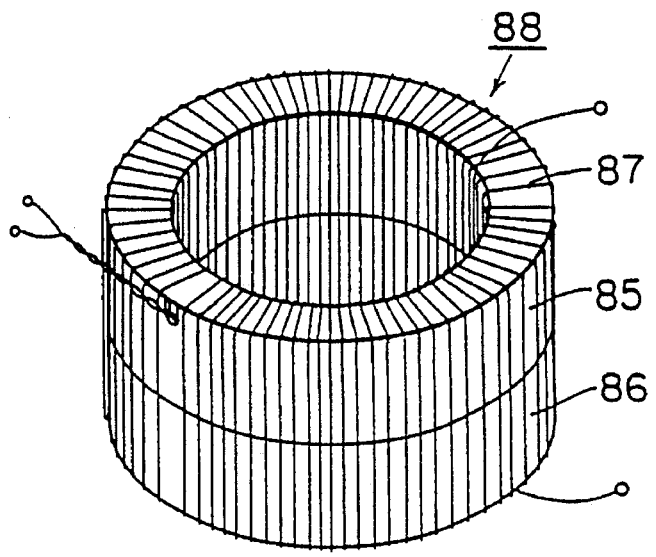
FIG. 16 is a perspective view showing an appearance of a DC current sensor of the present invention.

Furthermore, after covering the detecting core 84 shown in FIG. 15(B) with plastic cases 85, 86 shown in FIG. 15(A) and (C) to prevent from distortion, an enamel wire of 0.18 mm diameter was wound by 300 turns in a toroidal shape as a detecting coil 87, which is commonly used as a modulation coil, to prepare a DC current sensor according to the present invention shown in FIG. 16.

Figure 17:
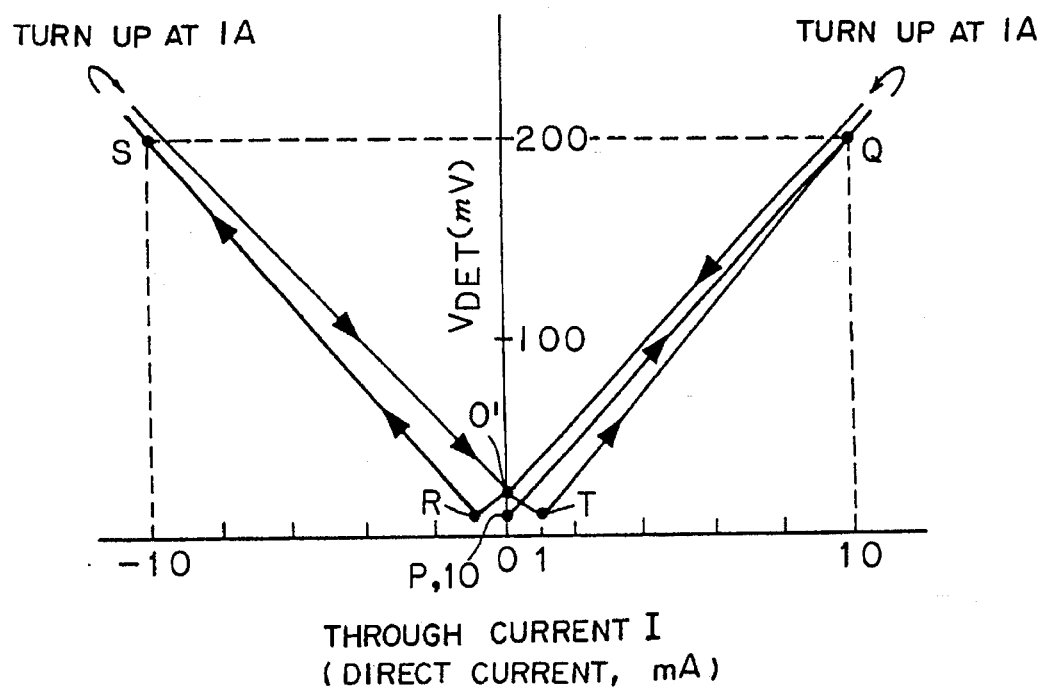
FIG. 17 is a linear graph showing the relationship between a current being detected and an output in a n ultra-microregion in a DC current sensor of the present invention.

An oscillator was connected to an excitation coil of the resulting DC current sensor, and a wide-band AC voltage meter was connected to the detecting coil, which is commonly used as the modulation coil, via a band-pass filter of resonance frequency $f_0=7$ kHz, Q=5, a lead wire connected to a DC power supply is extended through the detecting core. When an AC signal of 3.5 kHz and 10 Vrms was applied to the excitation coil, an electric current of 25 m Arms was produced. When an output voltage was measured after demagnetizing the core, it shows a point P (about 10 m Vrms) in FIG. 17, and when applying a through current the output voltage is incremented substantially linearly from P to Q.

As the through current I of 10 mA, the output voltage was 200 mV. When the through current I of 10 mA was applied again after increasing it to 1 A, though the output voltage is incremented by 2 to 3 mV, it shows approximately the same value as the initial value.

Thereafter, as the electric current reduces a locus Q→O' is obtained, and since the residual output at the time of O' is about 25 mV, when the direction of current is reversed, it takes a minimum value (about 10 mV) at I=−1 mA, and after passing a point R the output increases again (200 m Vrms at I=−10 mA). Thereafter, when the electric current is changed from −10 mA to +10 mA, the output changes as following the path S→O'→T→Q.

Thus, the DC current sensor according to the present invention is that, the effect of hysteresis of the material of the detecting core 2 is constant, and the output characteristics is substantially proportional linearly to the electric current I flowing through the lead wire being detected, so that it is understood that a good detecting capability of the DC current is accomplished.

EMBODIMENT 4

In a same manner as the Embodiment 3, an enamel wire of 0.1 mm diameter was wound by 100 turns around a paper bobbin of 3.5 mm height to prepare an excitation coil, which was contained in a detecting core of 5 mm height, 25 mm inside diameter and 31 mm outside diameter consisting of a permalloy material C of 0.25 mm thick, and after containing again in a plastic case, an enamel wire of 0.1 mm diameter was wound by 300 turns to obtain a detecting coil, which is used commonly as a modulation coil, and finally a DC current sensor of 8 mm height, 22 mm inside diameter and 34 mm outside diameter was obtained.

Figure 18A:
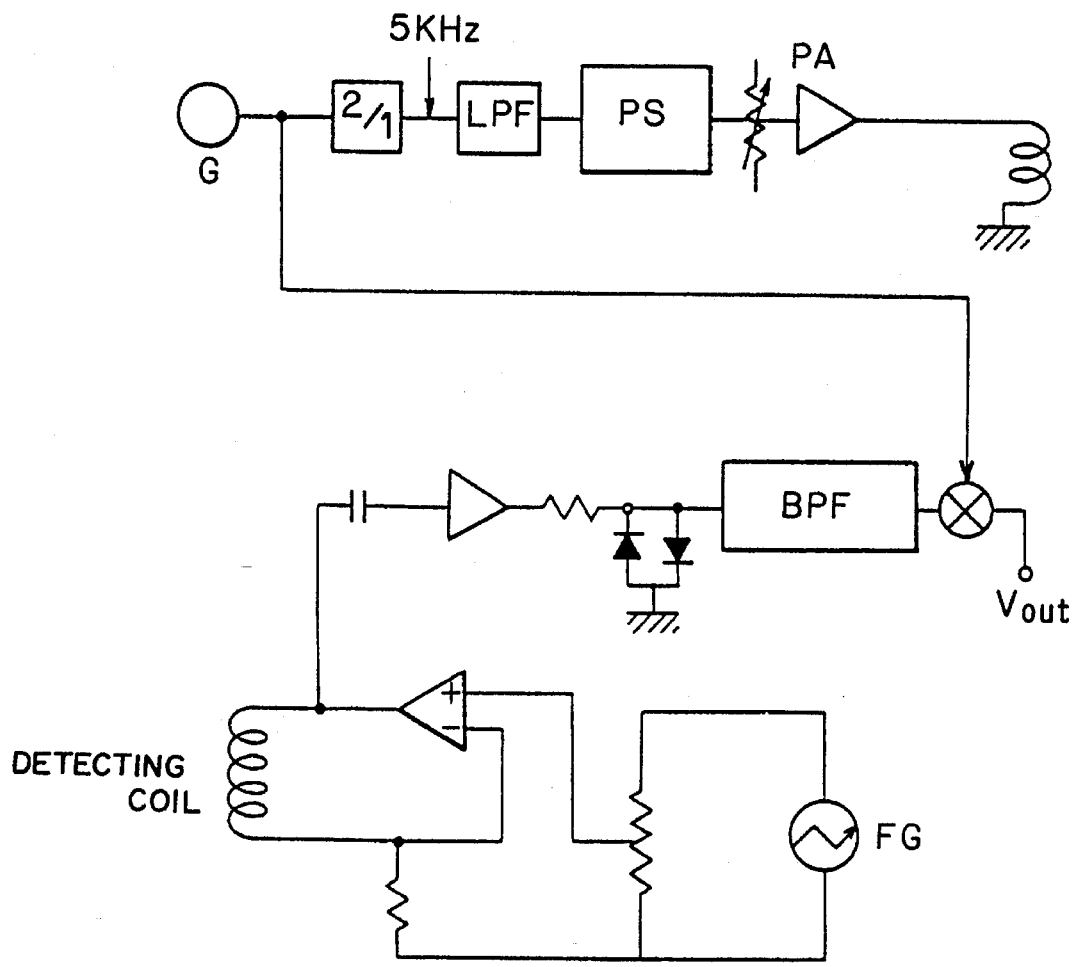
FIGS. 18(A) and (B) are circuit diagrams showing an outline of one embodiment of an electric circuit connected to a DC current sensor of the present invention.
Figure 18B:
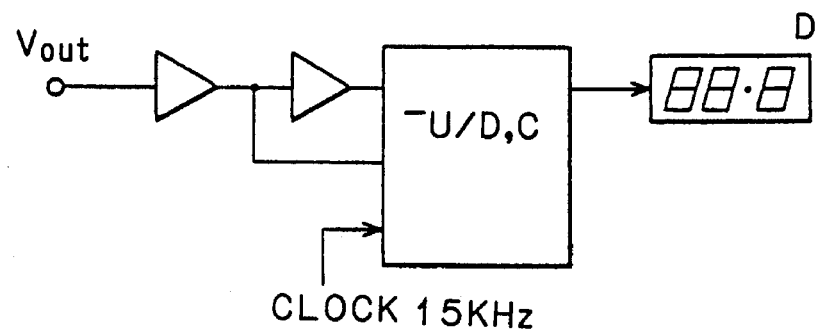

Then, the excitation coil and detecting coil of the DC current sensor were connected to a detecting circuit consisting of an electronic circuit shown in FIG. 18, and a lead wire connected to a DC powder supply is extended through the detecting core.

Describing in detail, a rectangular wave of 10 kHz was inputted to the excitation coil from an oscillator G via a ½ dividing circuit, an LPF (low-pass filter), a phase shifter PS and a power amplifier PA, and when an AC current of 5 kHz and 7 Vrms was applied to the excitation coil, and electric current of 20 m Arms was produced. Also, the triangular wave of 10 Hz is applied to the detecting coil, which is used commonly as the modulation coil, from a function generator FG, at this time, a peak value of a triangular wave current is 0.5 mA, and an output Vout of the detecting coil is inputted to a counter U/D.C via a diode limiter, a band pass filter BPF and a phase detector and displayed on a display D numerically.

In the following the principle of operation of the DC current sensor constituted as aforementioned is described with reference to the drawings.

FIG. 19 is an explanatory view of an output produced in the detecting coil in the state, where the electric current I is not flowing through the lead wire being detected. 1.

Figure 19A:
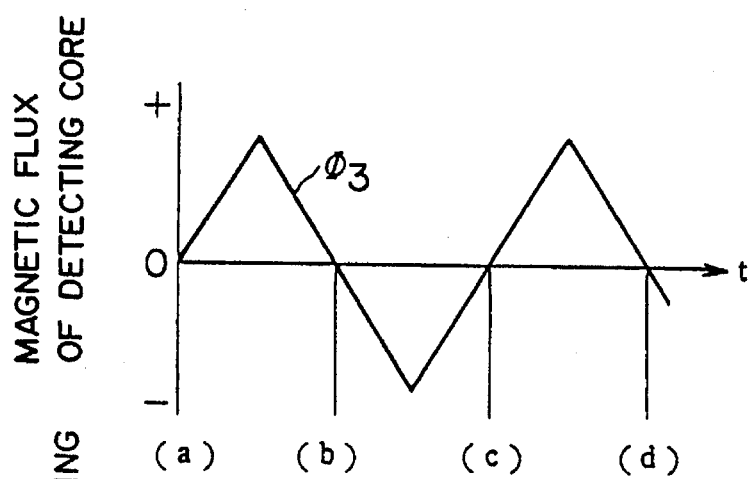
FIG. 19 is a graph showing variations of duty ratios (time ratio of positive and negative direction) of an output of a detecting coil.
Figure 19B:
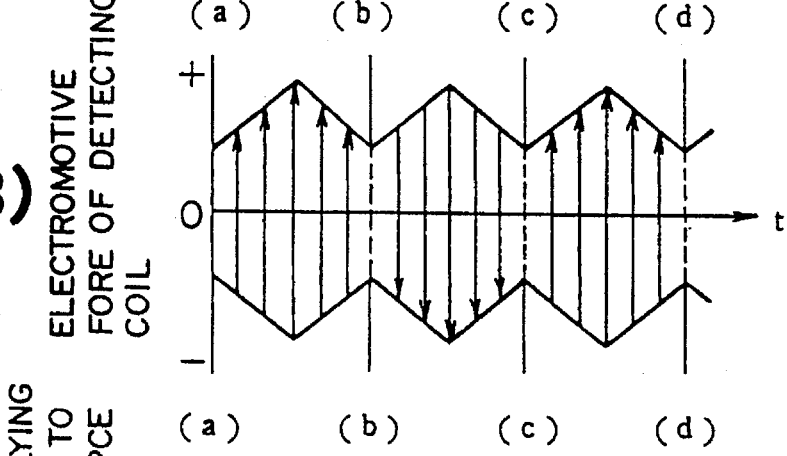
Figure 20A:
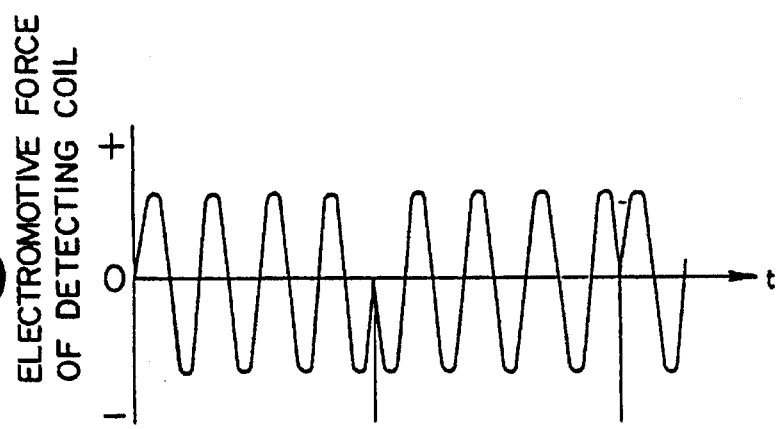
FIG. 20 is a graph for defining an indicating method of an electromotive force of a detecting coil in FIG. 19.
Figure 20B:
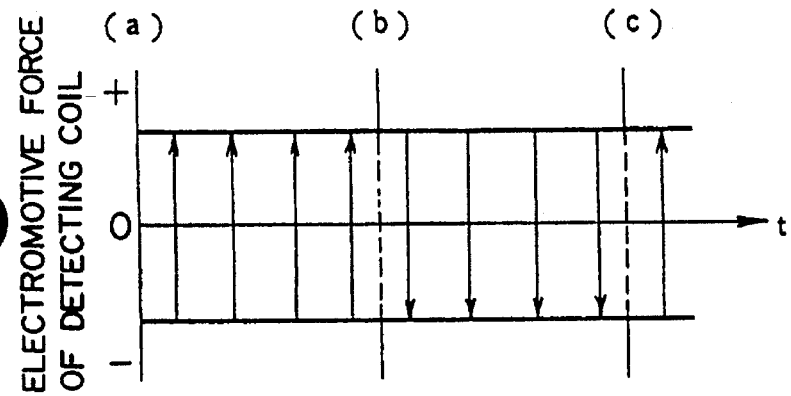

When a triangular waveform current whose direction and intensity change linearly periodically is applied to the detecting coil, a magnetic flux $\Phi_3$ as shown in FIG. 19(A) is produced in the detecting core, and an electromotive force as shown in FIG. 19(B) is produced in the detecting coil. In the figure, a direction of the arrow shows a phase of the electromotive force, and in FIG. 19(B), it shows that the phase difference between a-b, b-c is 180 degree. That is for the purpose of understanding the principle of operation of the present invention clearly, for the electromotive force having the phase difference as shown in FIG. 20(A), the direction of phase is shown by the arrow as shown in FIG. 20(B). (It is also same in the description of FIG. 21.)

Figure 19C:
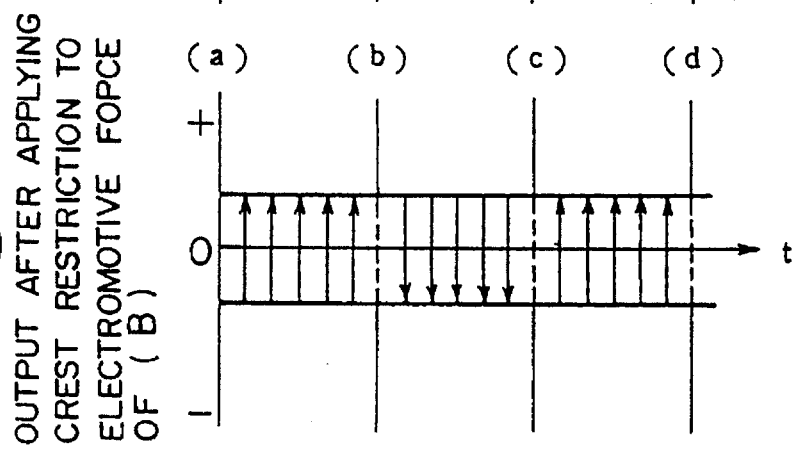
Figure 19D:
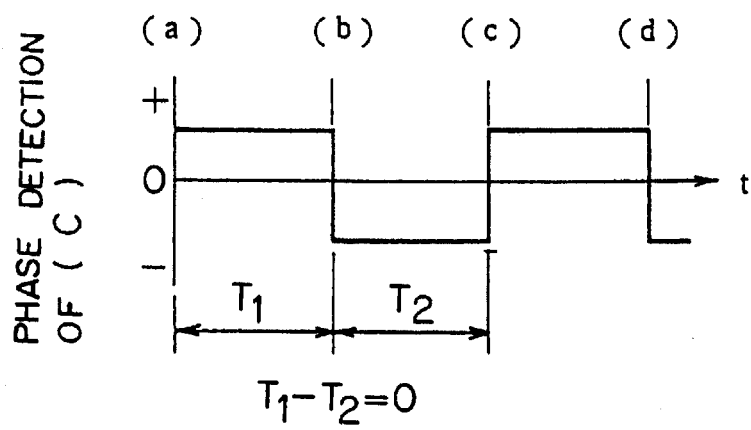

When the electromotive force as shown in FIG. 19(B) is passed through the limiter for crest restriction, the output as shown in FIG. 19(C) is obtained, and by the phase detection of this output, the output as shown in FIG. 19(D) is obtained.

In FIG. 19(D), an output time $T_1$ of the positive side (+) and an output time $T_2$ of the negative side (−) are measured to detect the time ratio (duty ratio).

In the state where the electric current I is not flowing through the lead wire being detected 1, as shown in FIG. 19(D), the output time $T_1$ of the positive side (+) and the output time $T_2$ of the negative side (−) are equal and their difference $(T_1-T_2)$ is zero.

FIG. 20 is an explanatory view of an output produced in the detecting coil in the state where the electric current I is flowing through the lead wire being detected 1.

Figure 21A:
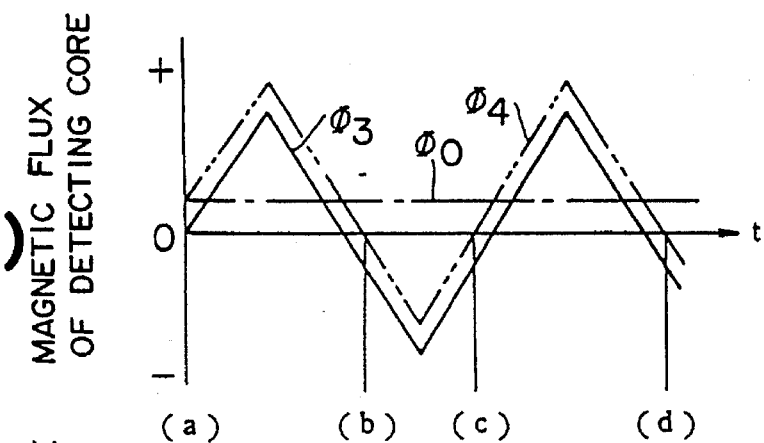
FIG. 21 is a graph showing variations of duty ratios of an output of a detecting coil.
Figure 21B:
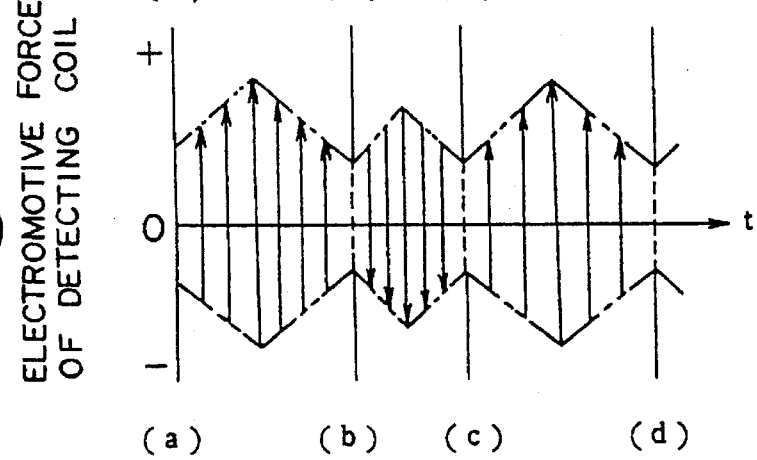

When the triangular waveform current whose direction and intensity change linearly periodically is applied to the detecting coil, a magnetic flux $\Phi_4$ as shown in FIG. 21(A) is produced in the detecting core 2, and an electromotive force as shown in FIG. 21(B) is produced in the detecting coil. That is, the magnetic flux produced by the triangular waveform current and the magnetic flux produced by the electric current I flowing through the lead wire being detected 1 are superposed $(\Phi_4=\Phi_3+\Phi_0)$.

Figure 21C:
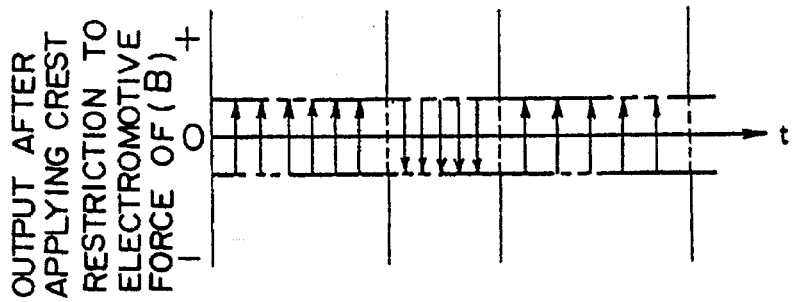
Figure 21D:
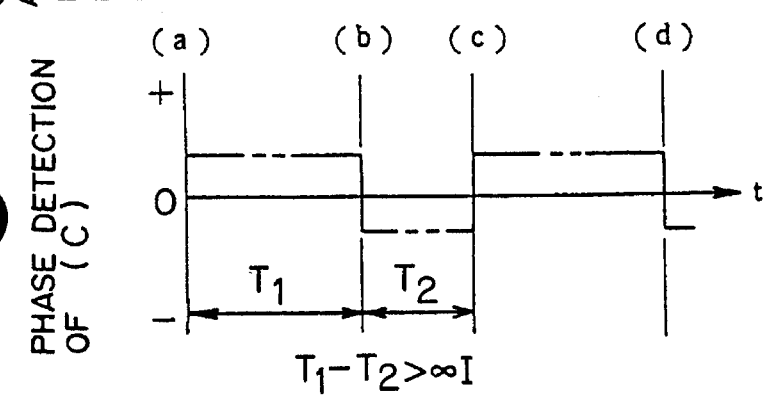

When an electromotive force as shown in FIG. 21(B) is passed through the limiter for crest restriction, an output as shown in FIG. 21(C) is obtained, and by the phase detection of this output an output as shown in FIG. 21(D) is obtained.

In FIG. 21(D), an output time $T_1$ of the positive side (+) and an output time $T_2$ of the negative side (−) are measured to detect the time ratio (duty ratio).

In the state where the electric current I is flowing through the lead wire being detect 1, as shown in FIG. 21(D), the output time $T_1$ of the positive side (+) is longer that the output time $T_2$ of the negative side (−) are measured to detect the time ratio (duty ratio).

In the state where the electric current I is flowing through the lead wire being detected 1, as shown in FIG. 21(D), the output time $T_1$ of the positive side (+) is longer that the output time $T_2$ of the negative side (−), and their difference $(T_1-T_2)$ is positive $(T_1-T_2>0)$.

Since the difference $(T_1-T_2)$ is proportional to the electric current I flowing through the lead wire being detected, an absolute value of the electric current I can be known by measuring a correlation of the detecting value and the electric current I beforehand.

Also, by confirming and setting the case where the difference $(T_1-T_2)$ is positive $(T_1-T_2>0)$ or negative $(T_1-T_2<0)$ and the direction of the electric current I flowing through the lead wire being detected beforehand, the direction and the absolute value of the electric current I can be detected simultaneously.

Furthermore, when a maximum value of the electric current applied to the detecting coil is set large enough to produce a magnetic field above the coercive force (±Hc) of the detecting core material, output characteristic hysteresis caused by the hysteresis of the detecting core 2 material can be reduced.

That is, when the principle of operation described with reference to FIG. 19 and FIG. 20 is studied taking into consideration of the coercive force of the detecting core 2 material, the magnetic flux produced in the detecting core shows a rectangular wave, and the output produced finally in the detecting coil also shows the same characteristics.

Figure 22A:
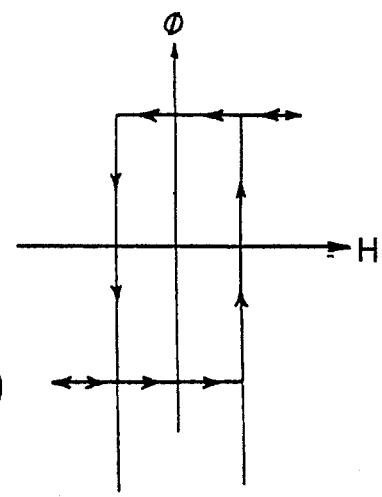
FIG. 22 is a graph showing variations of duty ratios of a magnetic flux in a detecting core.
Figure 22B:
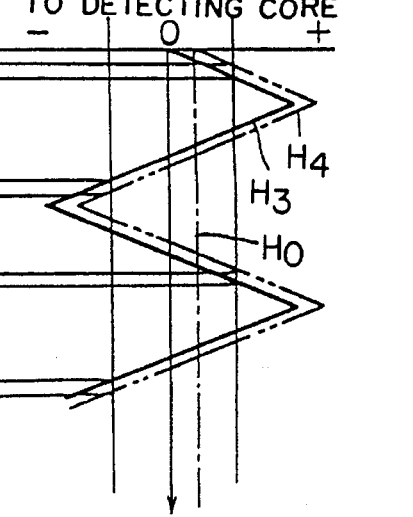
Figure 22C:
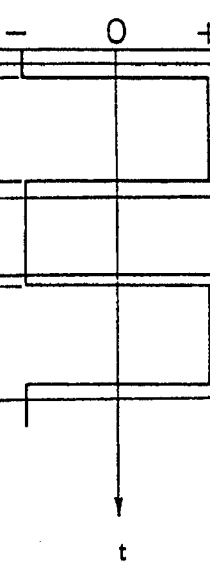

In the case where the electric current I is not flowing through the lead wire being detected 1, when the triangular waveform current is applied to the detecting coil, a magnetic field as $H_3$ shown in FIG. 22(B) is applied to the detecting core 2. At this time, the magnetic flux produced in the detecting core 2 is that, its direction changes (reverses) as the time changes as shown in FIG. 22(C) by the hysteresis of the detecting core 2 as shown in FIG. 22(A).

In this case, a producing time $T_1$ of the magnetic flux of the positive side (+) and a producing time $T_2$ of the magnetic flux of the negative side (−) are equal, and the difference $(T_1-T_2)$ is zero.

Meanwhile, in the case where the electric current I is flowing through the lead wire being detected 1, when the triangular waveform current is applied to the detecting coil, a magnetic field as $H_4$ shown in FIG. 22(B) is applied to the detecting core. At this time, the magnetic flux produced in the detecting core is that, its direction changes (reverses) as the time changes as shown in FIG. 22(D) by the hysteresis of the detecting core as shown in FIG. 22(A).

In this case, the producing time $T_1$ of the magnetic flux of the positive side (+) is longer than the producing time $T_2$ of the magnetic flux of the negative side (−) and the difference $(T_1-T_2)$ is positive $(T_1-T_2>9)$.

Figure 22D:
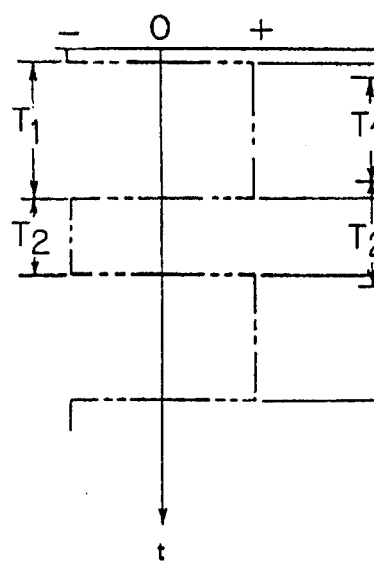

As it can be understood from the description of FIG. 19 and FIG. 20, output characteristics obtained by the phase detection of the electromotive force produced in the detecting coil by the magnetic flux shown in FIG. 22(C) and FIG. 22(D), after passing the electromotive force through the limiter for crest restriction, shows the same output time characteristics shown in FIG. 22(C) and FIG. 22(D).

Thus, by setting a maximum value of the electric current applied to the detecting coil large enough to produce the magnetic field above the coercive force of the detecting core material, the effect of hysteresis of the detecting core material becomes constant (a same hysteresis loop is always drawn), and since the difference $(T_1-T_2)$ is proportional to the electric current I flowing through the lead wire being detected, it is understood that the output characteristics obtained finally is linear.

Figure 23A:
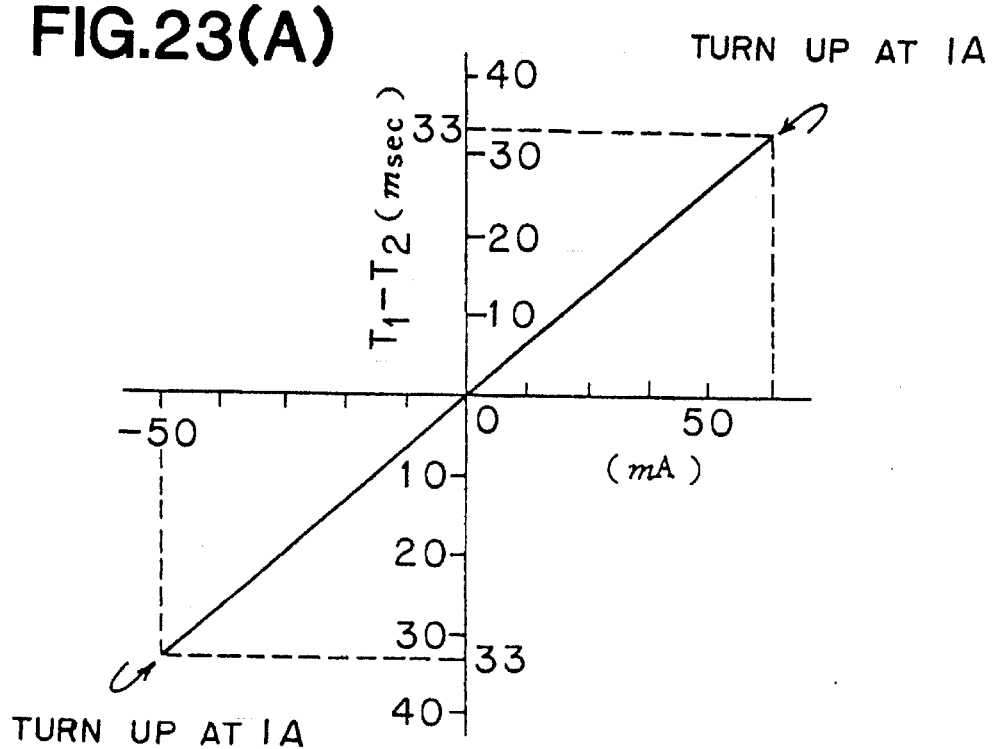
FIG. 23(A) is a graph showing the relationship between a difference $(T_1-T_2)$ and an electric current in the embodiment.
Figure 23B:
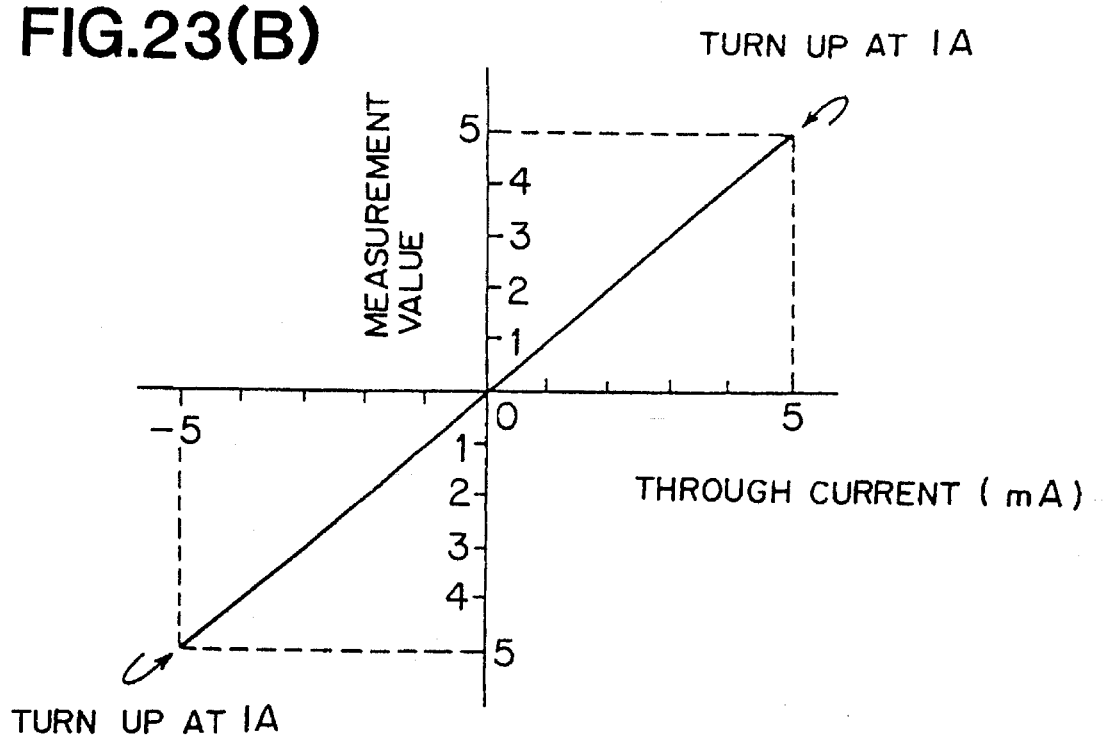
FIG. 23(B) is a graph showing the relationship between a reading value and a through current in the case of reading $T_1-T_2$ by a pulse count number.

When the difference $(T_1-T_2)$ was measured by using the aforementioned detecting circuit shown in FIG. 18, the characteristics as shown in FIG. 23(A) was obtained. Now, the relationship between a read value obtained by reading the difference $(T_1-T_2)$ by the pulse count number, after operating an Up-Down Counter by the output Vout and applying a pulse of 15 kHz, and the through current is shown in FIG. 23(B).

As shown in FIG. 23, it is also substantially linear even below 1 mA and error is ±0.1 mA, results in a good measurement accuracy at a micro-current.

I claim:

1. A DC current sensor, comprising:

a detecting core consisting of an annular soft magnetic material having a hollow portion extending in a circumferential direction within said core;

an excitation coil wound and disposed in a circumferential direction in the hollow portion;

a detecting coil toroidally wound around the detecting core;

a lead wire, through which a DC current for non-contact detection flows, and extended through the center of the detecting core;

AC current supply means for applying current to said excitation coil for periodically magnetically saturating the entire detecting core in both the circumferential and a direction perpendicular thereto, whereby the magnetic flux produced in the detecting core can be modulated according to the DC current flowing through said lead wire and being detected upon excitation of the excitation coil; and said detecting coil producing an electromotive force having a frequency twice the excitation current for detecting the DC current flowing through the lead wire.

2. A DC current sensor in accordance with claim 1, wherein said AC current supply means divides in half the frequency of the excitation current from an oscillator at twice the frequency of the excitation current, and is connected to said excitation coil, and further comprising modulation means for modulating the magnetic flux produced in the detecting core based on the DC current flowing through the lead wire, and phase comparison means for detecting the phase difference of the output of the oscillator and the output of the detecting coil having a frequency of two times the excitation current, whereby an absolute value and/or the direction of the DC current flowing through the lead wire can be detected.

3. A DC current sensor in accordance with claim 1, further comprising detecting means, which applies a magnetic flux whose direction and intensity change linearly and periodically to the detecting core, said detecting means detects the difference between the output time of the positive side and the output time of the negative side of the detecting coil, whereby an absolute value and/or the direction of the DC current flowing through the lead wire can be detected.

4. A DC current sensor in accordance with claim 3, further comprising a modulation coil extending in the same direction as the lead wire, whereby an alternating magnetic field produced by said modulation coil can be superimposed on the detecting coil.

5. A DC current sensor in accordance with claim 4, wherein the modulation coil and the detecting coil are housed in a body.

6. A DC current sensor in accordance with claim 1, wherein the detecting core is formed by an outer cylinder having a through hole in the center of a bottom thereof, and an inner cylinder having a collar portion around one end portion thereof.

7. A DC current sensor in accordance with claim 6, wherein an outer portion of said outer cylinder is surrounded by a shield case consisting of permalloy or non-oriented silicon steel plate.

8. A DC current sensor in accordance with claim 1, wherein the detecting core is formed by an inner cylinder having one end portion bent outwardly, and an outer cylinder having one end portion is bent inwardly.

9. A DC current sensor in accordance with claim 1, wherein the detecting core is made of one or more kinds of permalloy, silicon steel plate, amorphous, electromagnetic soft iron and soft ferrite.

10. A DC current sensor in accordance with claim 1, wherein the detecting core divided, at least, at one location in a circumferential direction.

11. A DC current sensor in accordance with claim 10, the excitation coil consists of a pair of semicircular excitation coil members, and a detecting core is a pair of semicircular detecting core members and a pair of semicircular plates disposed so as to surround said excitation coil members.

12. A DC current sensor in accordance with claim 1, wherein the detecting core consists of an integrated-type detecting core member formed by laminating a pair of horseshoe-shaped cylinders vertically in a body, and a separated-type detecting core member in which a pair of horseshoe-shaped cylinders are disposed to form a predetermined gap to clamp said integrated-type detecting core member therebetween, and excitation coil consists of a pair of independent excitation coil portions which are bent and disposed to communicate through the horseshoe-shaped cylinders constituting said integrated-type detecting core member and separated-type detecting core member, and the detecting coil consists of a pair of independent detecting coil portions which are wound in a toroidal shape around said integrated-type detecting core member and separated-type detecting core member.

13. A DC current sensor in accordance with claim 12, wherein an integrated-type detecting core member is formed by a pair of U-shaped members and a partition plate, and horseshoe-shaped cylinders constituting a separated-type detecting core member are respectively formed by a U-shaped groove member and a cover plate.

\* \* \* \* \*